US012769211B2

(12) United States Patent
Park et al.

(10) Patent No.: US 12,769,211 B2
(45) Date of Patent: Oct. 20, 2026

(54) SUBSTRATE WEIGHT MEASUREMENT APPARATUS, A SUBSTRATE PROCESSING APPARATUS INCLUDING THE SAME, AND A METHOD OF PROCESSING A SUBSTRATE USING THE SUBSTRATE PROCESSING APPARATUS

(71) Applicant: SAMSUNG ELECTRONICS CO., LTD., Suwon-si (KR)

(72) Inventors: Sangjine Park, Suwon-si (KR); Ji Hwan Park, Suwon-si (KR); Kuntack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 799 days.

(21) Appl. No.: 18/076,591

(22) Filed: Dec. 7, 2022

(65) Prior Publication Data

US 2023/0384681 A1 Nov. 30, 2023

(30) Foreign Application Priority Data

May 27, 2022 (KR) ........................ 10-2022-0065348

(51) Int. Cl.

| | |
|---|---|
| ***G03F 7/30*** | (2006.01) |
| ***G03F 7/00*** | (2006.01) |
| ***G03F 7/20*** | (2006.01) |
| ***G03F 7/40*** | (2006.01) |
| *G01G 19/40* | (2006.01) |
| *G01L 13/00* | (2006.01) |

(52) U.S. Cl.

CPC .................. *G03F 7/30* (2013.01); *G03F 7/40* (2013.01); *G03F 7/70608* (2013.01); *G01G 19/40* (2013.01); *G01L 13/00* (2013.01)

(58) Field of Classification Search

CPC .......... G03F 7/30; G03F 7/40; G03F 7/70608; G01C 19/40; G01L 3/00

See application file for complete search history.

(56) References Cited

U.S. PATENT DOCUMENTS

| | | | | |
|---|---|---|---|---|
| 6,221,171 | B1 * | 4/2001 | Maekawa | H01L 21/67051 134/32 |
| 10,695,804 | B2 | 6/2020 | Mostovoy et al. | |
| 2003/0092261 | A1 * | 5/2003 | Kondo | H01L 21/67184 257/E21.174 |

(Continued)

FOREIGN PATENT DOCUMENTS

| | | | |
|---|---|---|---|
| JP | 4192172 | B2 | 12/2008 |
| JP | 5471886 | B2 | 4/2014 |

(Continued)

*Primary Examiner* — Connor J Tremarche

(74) *Attorney, Agent, or Firm* — Sughrue Mion, PLLC

(57) ABSTRACT

A substrate processing apparatus includes a wetting apparatus that supplies a fluid onto a substrate, a substrate weight measurement apparatus that measures a weight of the substrate which has passed through the wetting apparatus, and a drying apparatus that dries the substrate which has passed through the substrate weight measurement apparatus. The substrate weight measurement apparatus includes a measurement chamber providing a measurement space, a measurement stage in the measurement chamber, and a weight sensing sensor that senses the weight of the substrate disposed on the measurement stage.

20 Claims, 20 Drawing Sheets

(56) References Cited

U.S. PATENT DOCUMENTS

| | | | | |
|---|---|---|---|---|
| 2004/0225399 | A1* | 11/2004 | Chen | H01L 21/67288 700/121 |
| 2006/0223899 | A1 | 10/2006 | Hillman et al. | |
| 2007/0012337 | A1 | 1/2007 | Hillman et al. | |
| 2009/0301518 | A1* | 12/2009 | Oikawa | H01L 21/02052 134/184 |
| 2018/0358242 | A1* | 12/2018 | Kim | H01L 21/67126 |
| 2019/0113853 | A1* | 4/2019 | Onvlee | G03F 7/70708 |
| 2022/0152780 | A1* | 5/2022 | Douki | B24B 49/16 |

FOREIGN PATENT DOCUMENTS

| | | | |
|---|---|---|---|
| KR | 10-2015-0039189 | A | 4/2015 |
| KR | 101590906 | B1 | 2/2016 |
| KR | 10-2019-0039492 | A | 4/2019 |
| KR | 10-2019-0083615 | A | 7/2019 |
| KR | 1020190143679 | A | 12/2019 |
| KR | 10-2020-0111294 | A | 9/2020 |
| KR | 10-2022-0001770 | A | 1/2022 |

* cited by examiner

SUBSTRATE WEIGHT MEASUREMENT APPARATUS, A SUBSTRATE PROCESSING APPARATUS INCLUDING THE SAME, AND A METHOD OF PROCESSING A SUBSTRATE USING THE SUBSTRATE PROCESSING APPARATUS

CROSS-REFERENCE TO RELATED APPLICATIONS

This U.S. non-provisional patent application is based on and claims priority under 35 U.S.C. § 119 from Korean Patent Application No. 10-2022-0065348, filed on May 27, 2022, in the Korean Intellectual Property Office, the entire contents of which are hereby incorporated by reference.

BACKGROUND

The present disclosure relates to a substrate weight measurement apparatus, a substrate processing apparatus including the same, and a method of processing a substrate using the substrate processing apparatus, and more particularly, to a substrate weight measurement apparatus capable of accurately determining a wetting amount of a substrate, a substrate processing apparatus including the same, and a method of processing a substrate using the substrate processing apparatus.

A semiconductor device may be manufactured by various processes. For example, the semiconductor device may be manufactured by a photolithography process, an etching process, a deposition process, and a plating process. In the photolithography process for manufacturing the semiconductor device, a wetting process of applying liquid (e.g., a developing solution) onto a wafer may be performed. In addition, a drying process of removing the liquid, applied on the wafer, from the wafer may be performed. Various methods may be used to apply the liquid onto the wafer and/or to remove the liquid from the wafer.

SUMMARY

Some embodiments may provide a substrate weight measurement apparatus capable of accurately measuring a weight of a wetted substrate, a substrate processing apparatus including the same, and a method of processing a substrate using the substrate processing apparatus.

Some embodiments may also provide a substrate weight measurement apparatus capable of reducing evaporation of a fluid from a substrate while measuring a weight of the substrate, a substrate processing apparatus including the same, and a method of processing a substrate using the substrate processing apparatus.

Some embodiments may further provide a substrate weight measurement apparatus capable of maintaining a wetting amount of a substrate at a certain level, a substrate processing apparatus including the same, and a method of processing a substrate using the substrate processing apparatus.

Some embodiments may further provide a substrate weight measurement apparatus capable of preventing another apparatus from being contaminated by a fluid evaporated from a substrate, a substrate processing apparatus including the same, and a method of processing a substrate using the substrate processing apparatus.

According to an aspect of one or more embodiments, a substrate processing apparatus may include a wetting apparatus configured to supply a fluid onto a substrate, a substrate weight measurement apparatus configured to measure a weight of the substrate which has passed through the wetting apparatus, and a drying apparatus configured to dry the substrate which has passed through the substrate weight measurement apparatus. The substrate weight measurement apparatus may include a measurement chamber providing a measurement space, a measurement stage in the measurement chamber, and a weight sensing sensor configured to sense the weight of the substrate disposed on the measurement stage.

According to an aspect of one or more embodiments, a substrate weight measurement apparatus may include a measurement chamber providing a measurement space, a measurement stage in the measurement chamber, and a weight sensing sensor configured to sense a weight of a substrate disposed on the measurement stage. The measurement chamber may have an insertion hole through which the substrate is passed, and an air outlet spaced apart from the insertion hole, the air outlet configured to exhaust air in the measurement space.

According to an aspect of one or more embodiments, a method of processing a substrate may include wet-processing a substrate, measuring a weight of the substrate that has been wet-processed, and dry-processing the substrate of which the weight has been measured. The wet-processing of the substrate may include supplying a fluid onto the substrate disposed in a wet chamber. The measuring of the weight of the substrate may include disposing the substrate that has been taken out of the wet chamber in a measurement chamber, and sensing the weight of the substrate by a weight sensing sensor in the measurement chamber. The dry-processing of the substrate may include disposing the substrate in a drying chamber, and supplying a supercritical fluid into the drying chamber to dry the fluid on the substrate.

DETAILED DESCRIPTION

Figure 1:
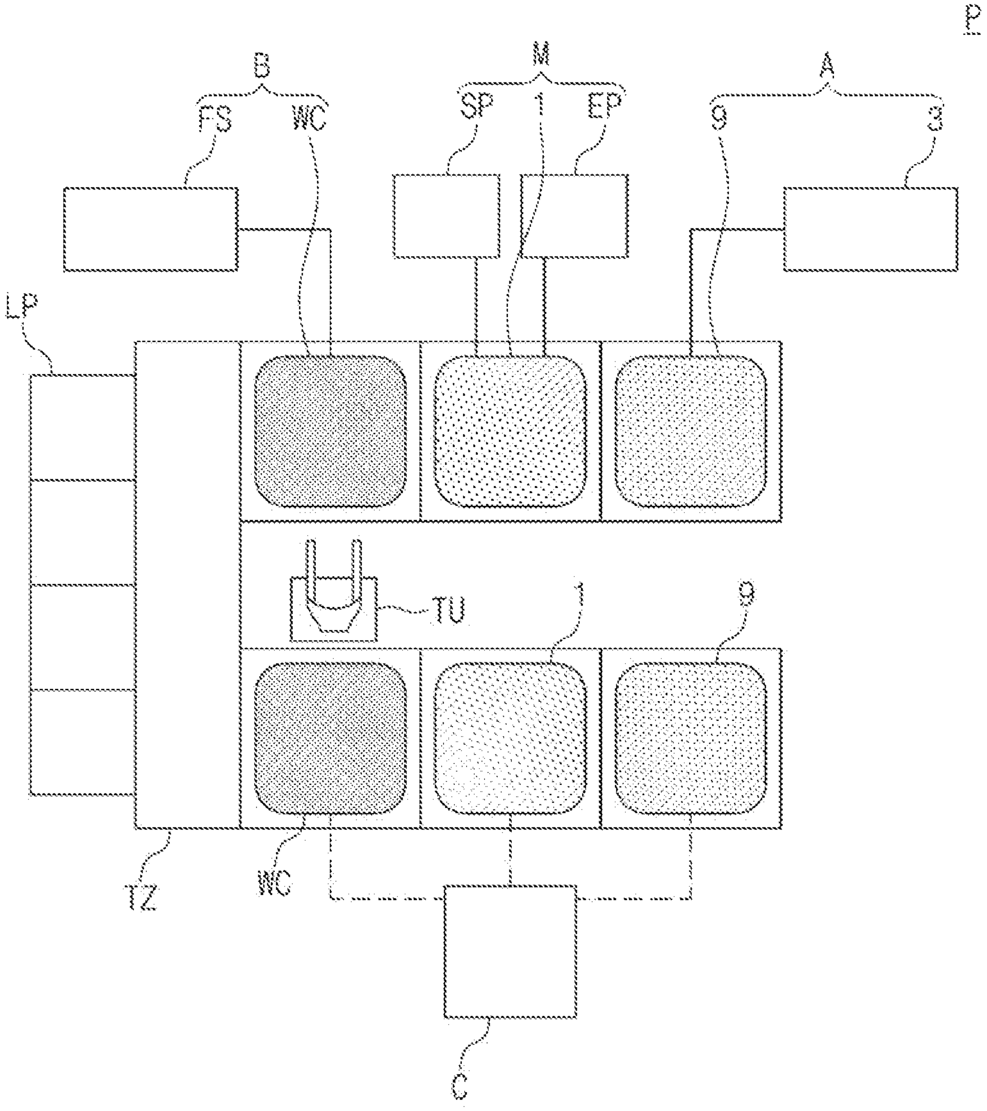
FIG. 1 is a schematic view illustrating a substrate processing apparatus according to some embodiments.

Hereinafter, various embodiments will be described in detail with reference to the accompanying drawings. The same reference numerals or the same reference designators may denote the same components or elements throughout the specification.

FIG. 1 is a schematic view illustrating a substrate processing apparatus according to some embodiments.

Referring to FIG. 1, a substrate processing apparatus P may be provided. The substrate processing apparatus P may be an apparatus of processing a substrate in a semiconductor manufacturing process. More particularly, the substrate processing apparatus P may be an apparatus of performing a wetting process and a drying process on a substrate. In other words, the substrate processing apparatus P may be configured to wet a substrate by supplying or spraying liquid onto the substrate and/or may be configured to dry and clean the substrate by removing liquid on the substrate from the substrate. For example, the substrate processing apparatus P may be configured to supply or spray a developing solution onto a substrate on which an extreme ultraviolet (EUV) exposure process was performed. In addition, the substrate processing apparatus P may be configured to dry the developing solution on the substrate. The term 'substrate' used in the present specification may mean a semiconductor wafer. The semiconductor wafer may include, but is not limited to, a silicon (Si) wafer. The substrate processing apparatus P may include a loading port LP, a transfer zone TZ, a wetting apparatus B, a transfer unit TU, a substrate weight measurement apparatus M, a drying apparatus A, and a controller C.

The loading port LP may be a port on which a substrate is loaded. For example, a substrate on which various semiconductor manufacturing processes were performed may be loaded on the loading port LP. The loading port LP may be provided in plurality. A plurality of substrates may be loaded on each of the plurality of loading ports LP. However, a single loading port LP will be mainly described hereinafter for the purpose of ease and convenience in explanation.

The transfer zone TZ may be a zone used to move or transfer a substrate loaded on the loading port LP. For example, the transfer unit TU may transfer the substrate loaded on the loading port LP into the wetting apparatus B and/or the drying apparatus A through the transfer zone TZ. The transfer zone TZ may cover the plurality of loading ports LP.

The wetting apparatus B may be an apparatus of performing a wetting process on a substrate. The wetting apparatus B may include a wet chamber WC and a fluid supply FS.

The wet chamber WC may provide a space in which the wetting process is performed. When a substrate is disposed in the wet chamber WC, liquid (e.g., various chemicals and/or IPA) may be coated or applied onto the substrate. The coating of the liquid may be performed by various methods. For example, the liquid may be supplied or sprayed onto a rotating substrate, and thus the liquid may be uniformly distributed on the substrate by centrifugal force. The wet chamber WC may be provided in plurality. For example, two wet chambers WC may be provided. The two wet chambers WC may be disposed to face each other, as illustrated in FIG. 1. However, a single wet chamber WC will be mainly described hereinafter for the purpose of ease and convenience in explanation. The wet chamber WC will be described later in more detail with reference to FIG. 2.

The fluid supply FS may be configured to supply a fluid into the wet chamber WC. To achieve this supply, the fluid supply FS may include a fluid tank and a pump. The fluid supplied into the wet chamber WC by the fluid supply FS may be referred to as a process fluid. The process fluid may include various chemicals and/or water. More particularly, the process fluid may include the developing solution or isopropyl alcohol (IPA).

The transfer unit TU may be configured to transfer a substrate. For example, the transfer unit TU may transfer the substrate loaded on the loading port LP into the wetting apparatus B through the transfer zone TZ. In addition, the transfer unit TU may take the substrate out of the wetting apparatus B and then may transfer the substrate into the drying apparatus A. To achieve this transfer, the transfer unit TU may include an actuator (e.g., a motor). A single transfer unit TU may be provided, but embodiments of the inventive concepts are not limited thereto.

The substrate weight measurement apparatus M may be configured to measure a weight of a substrate. More particularly, the substrate weight measurement apparatus M may be configured to measure a weight of a substrate which has passed through the wetting apparatus B. In other words, after the wetting process has been performed in the wetting apparatus B, the substrate weight measurement apparatus M may measure the weight of the substrate. The substrate weight measurement apparatus M may include a measurement chamber 1, an air supply SP, and an air exhaust unit EP.

The measurement chamber 1 may provide a space in which measurement of a weight is performed. When the substrate coated with the process fluid is taken out of the wetting apparatus B and then is placed in the measurement chamber 1, a weight of the substrate and the fluid on the substrate may be measured. In other words, the weight of the substrate may be measured in an independent space which is the measurement chamber 1. The measurement chamber 1 may be located adjacent to the wet chamber WC. For example, the measurement chamber 1 may be located right next to the wet chamber WC. In this case, the process of transferring the substrate from the wet chamber WC into the measurement chamber 1 by the transfer unit TU may be quickly performed. The measurement chamber 1 will be described later in more detail with reference to FIGS. 3 and 4.

The air supply SP may be configured to supply air. More particularly, the air supply SP may be configured to supply the air into the measurement chamber 1. Pressure, humidity and/or temperature in the measurement chamber 1 may be controlled by the air supply SP. The air supply SP may include at least one of various components for supplying the air into the measurement chamber 1. For example, the air supply SP may include a temperature humidity air controller (THC). Thus, air having constant pressure, humidity and/or temperature may be supplied into the measurement chamber 1. However, embodiments are not limited thereto, and in certain embodiments, the air supply SP may include a fan and/or a compressor. This configuration will be described later in detail.

The air exhaust unit EP may be configured to exhaust air in the measurement chamber 1. For example, the air exhaust unit EP may be configured to exhaust the air from the measurement chamber 1 in such a way that the pressure in the measurement chamber 1 is maintained at a certain level. The air exhaust unit EP may include at least one of various components for exhausting air. For example, the air exhaust unit EP may include a pump.

The drying apparatus A may be an apparatus for drying a substrate. For example, the drying apparatus A may be configured to dry and/or clean a substrate which has passed through the wetting apparatus B and/or the substrate weight measurement apparatus M. In other words, the drying apparatus A may remove the liquid from the substrate coated with the developing solution and/or IPA in the wetting apparatus B. The drying apparatus A may include a drying chamber 9 and a drying fluid supply 3.

The drying chamber 9 may provide a space in which a drying process is performed. The drying chamber 9 may be located adjacent to the measurement chamber 1. For example, the drying chamber 9 may be located right next to the measurement chamber 1. In this case, a process of transferring a substrate from the measurement chamber 1 into the drying chamber 9 by the transfer unit TU may be quickly performed. The drying chamber 9 may be provided in plurality. For example, two drying chambers 9 may be provided. The two drying chambers 9 may be disposed to face each other, as illustrated in FIG. 1. However, a single drying chamber 9 will be mainly described for the purpose of ease and convenience in explanation.

The drying fluid supply 3 may be configured to supply a fluid into the drying chamber 9. More particularly, the drying fluid supply 3 may be configured to supply a drying fluid sprayed into the drying chamber 9. The drying fluid supplied by the drying fluid supply 3 may be carbon dioxide ($CO_2$). The carbon dioxide ($CO_2$) sprayed into the drying chamber 9 may be in a supercritical fluid (SCF) state. The drying apparatus A will be described later in more detail with reference to FIGS. 5 and 6.

The controller C may be configured to control the wetting apparatus B, the substrate weight measurement apparatus M, and the drying apparatus A. For example, the controller C may control the drying fluid supply 3 to adjust a degree of drying of a substrate. More particularly, the controller C may control a flow rate of the drying fluid supplied into the drying chamber 9. This control will be described later in more detail.

Figure 2:
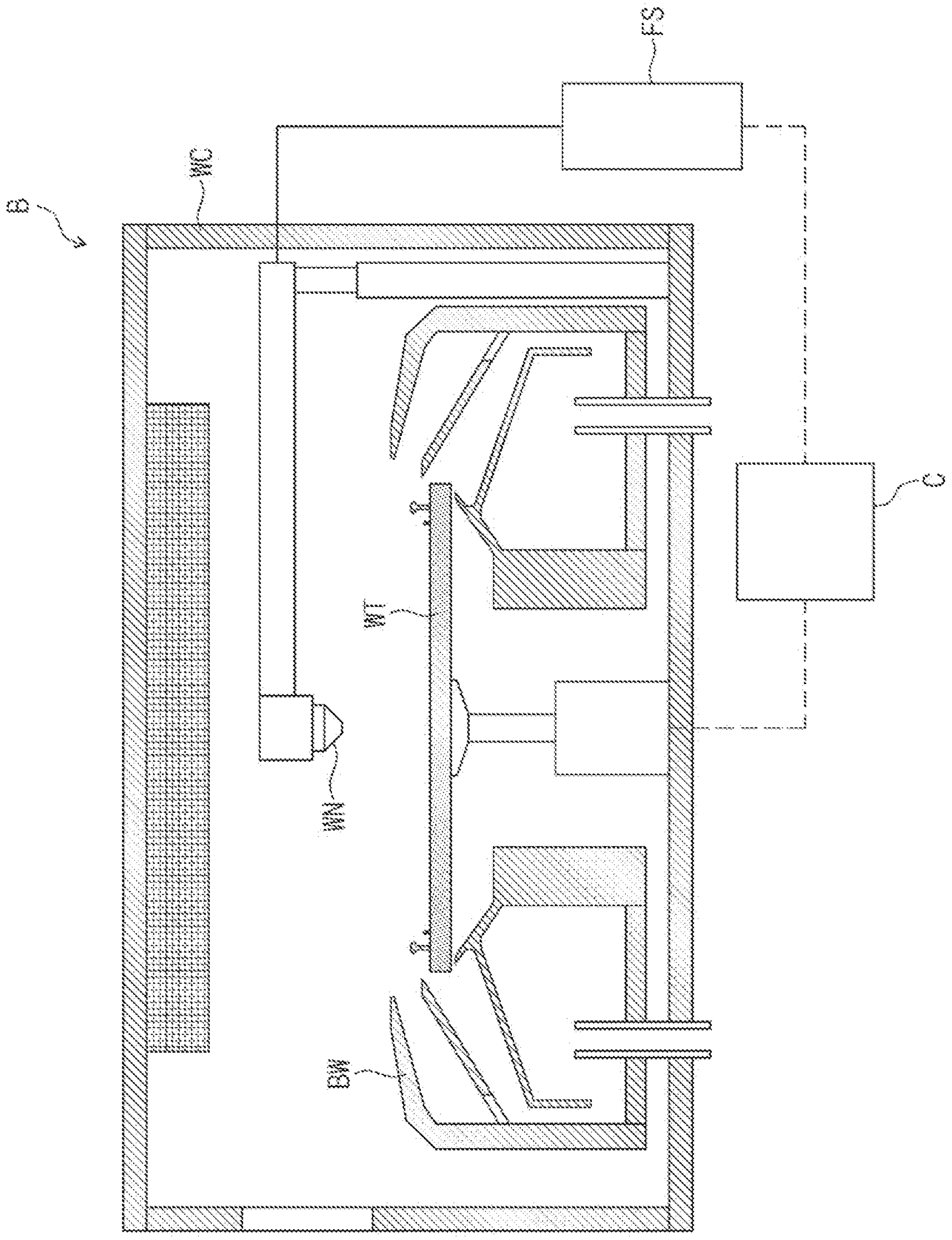
FIG. 2 is a cross-sectional view illustrating a wetting apparatus according to some embodiments.

FIG. 2 is a cross-sectional view illustrating a wetting apparatus according to some embodiments.

Referring to FIG. 2, the wetting apparatus B may further include a wetting stage WT, a wetting nozzle WN, and a bowl BW.

The wetting stage WT may be located in the wet chamber WC. The wetting stage WT may support a substrate. In other words, the substrate inserted in the wet chamber WC may be disposed on the wetting stage WT. The wetting stage WT may be configured to rotate the substrate. This rotation will be described later in detail.

The wetting nozzle WN may be spaced upward from the wetting stage WT. The wetting nozzle WN may be connected to the fluid supply FS. The wetting nozzle WN may be supplied with the process fluid from the fluid supply FS and may supply or spray the process fluid toward the wetting stage WT.

The bowl BW may surround the wetting stage WT. The bowl BW may collect the process fluid escaping or scattered from the wetting stage WT to the outside of the wetting stage WT.

Figure 3:
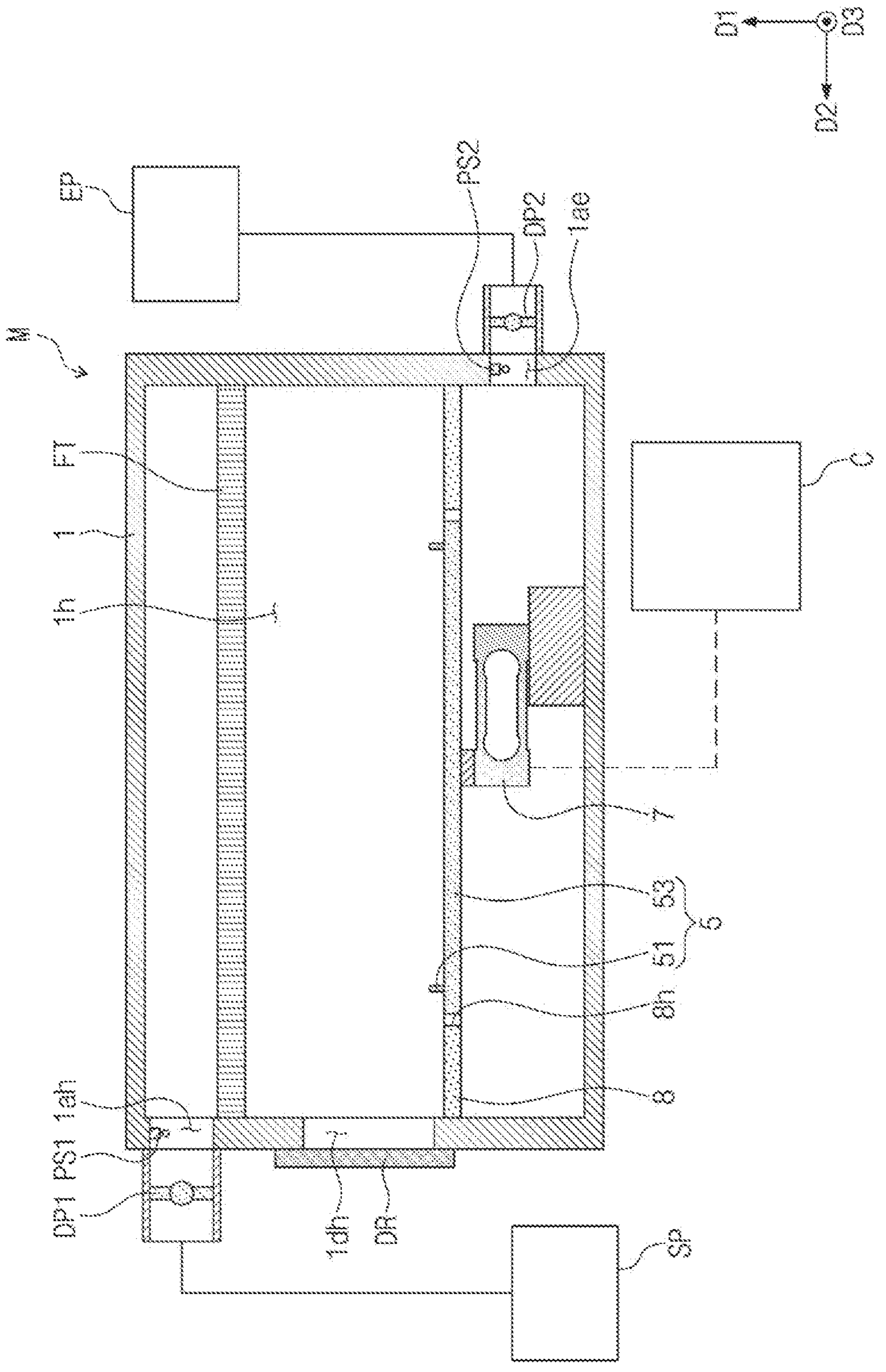
FIG. 3 is a cross-sectional view illustrating a substrate weight measurement apparatus according to some embodiments.

FIG. 3 is a cross-sectional view illustrating a substrate weight measurement apparatus according to some embodiments.

Hereinafter, a reference designator D1 may be referred to as a first direction, a reference designator D2 intersecting the first direction D1 may be referred to as a second direction, and a reference designator D3 intersecting both the first direction D1 and the second direction D2 may be referred to as a third direction. Alternatively, the first direction D1 may be referred to as a vertical direction. In addition, each of the second direction D2 and the third direction D3 may be referred to as a horizontal direction.

Referring to FIG. 3, the substrate weight measurement apparatus M may include the measurement chamber 1, a measurement door DR, a measurement stage 5, a separation plate 8, a weight sensing sensor 7, a filter FT, an inlet damper DP1, an outlet damper DP2, a first differential pressure sensor PS1, and a second differential pressure sensor PS2.

The measurement chamber 1 may provide a measurement space 1*h*. The measurement space 1*h* may be separated from an outside space of the measurement chamber 1 by the measurement chamber 1. The outside space may mean a space outside the measurement chamber 1. A weight of a substrate may be measured in a state in which the substrate is disposed in the measurement space 1*h*. The measurement chamber 1 may have an outward shape of, but is not limited to, a hexahedral and/or circular pillar shape. The measurement chamber 1 may have an insertion hole 1*dh*, an air inlet 1*ah*, and an air outlet 1*ae*.

The insertion hole 1*dh* may penetrate a surface of the measurement chamber 1. The insertion hole 1*dh* may connect the measurement space 1*h* to the outside space. A substrate may pass through the insertion hole 1*dh*. A substrate may be provided or loaded into the measurement chamber 1 through the insertion hole 1*dh*, by passing the substrate through the insertion hole 1*dh*. In addition, the substrate may be unloaded from the measurement chamber 1 through the insertion hole 1*dh*, by passing the substrate through the insertion hole 1*dh*. The insertion hole 1*dh* may be formed in a side surface of the measurement chamber 1, but embodiments are not limited thereto. The insertion hole 1*dh* may be selectively opened and closed by the measurement door DR. While FIG. 3 illustrates a single insertion hole 1*dh* that is used for both loading and unloading a substrate from the measurement chamber 1, embodiments are not limited thereto and, in some embodiments, an extraction hole that is separate from the insertion hole 1*dh* may be provided, and a substrate may be loaded through the insertion hole 1*dh* and unloaded through the extraction hole.

The air inlet 1*ah* may penetrate a surface of the measurement chamber 1. The measurement space 1*h* may be connected to the outside space through the air inlet 1*ah*. Air of the outside space of the measurement chamber 1 may flow into the measurement space 1*h* through the air inlet 1*ah*. In some embodiments, the air inlet 1*ah* may be spaced apart from the insertion hole 1*dh*. In other words, the air inlet 1*ah* may be an additional hole separated from the insertion hole 1*dh*. The air inlet 1*ah* may be formed in a side surface of the measurement chamber 1, but embodiments are not limited thereto. The air inlet 1*ah* may be selectively opened and closed by the inlet damper DP1. The air inlet 1*ah* may be connected to the air supply SP. Air supplied from the air supply SP may move into the measurement space 1*h* through the air inlet 1*ah*. This supply will be described later in detail.

The air outlet 1*ae* may penetrate a surface of the measurement chamber 1. The measurement space 1*h* may be connected to the outside space through the air outlet 1*ae*. Air in the measurement space 1*h* of the measurement chamber 1 may be exhausted to the outside space through the air outlet 1*ae*. In some embodiments, the air outlet 1*ae* may be spaced apart from the insertion hole 1*dh* and/or the air inlet 1*ah*. In other words, the air outlet 1*ae* may be an additional hole separated from the insertion hole 1*dh* and/or the air inlet 1*ah*. The air outlet 1*ae* may be formed in a side surface of the measurement chamber 1, but embodiments are not limited thereto. The air outlet 1*ae* may be selectively opened and closed by the outlet damper DP2. The air outlet 1*ae* may be connected to the air exhaust unit EP. The air of the measurement space 1_h_ may move to the air exhaust unit EP through the air outlet 1_ae_. This movement will be described later in detail.

The measurement door DR may be coupled to the measurement chamber 1 to selectively open and close the insertion hole 1_dh_. When the measurement door DR closes the insertion hole 1_dh_, the measurement space 1_h_ may be sealed from the outside space. Thus, when the measurement door DR closes the insertion hole 1_dh_, it is possible to prevent a fluid of the outside space from flowing into the measurement space 1_h_ through the insertion hole 1_dh_. In addition, when the measurement door DR closes the insertion hole 1_dh_, it is possible to prevent a fluid of the measurement space 1_h_ from escaping to the outside space through the insertion hole 1_dh_. The measurement door DR may be automatically opened and closed under control of the controller C. In some embodiments, the measurement door DR may be automatically opened and closed by a separate driving mechanism (not shown) under control of the controller C.

The measurement stage 5 may be located in the measurement chamber 1. The measurement stage 5 may support a substrate. A weight of the substrate provided in the measurement space 1_h_ may be measured while being disposed or placed on the measurement stage 5. The measurement stage 5 may include a support plate 53 and a plurality of pins 51.

The pins 51 may vertically extend. A substrate may be disposed or placed on the pins 51. In other words, the pins 51 may support the substrate. The pins 51 will be described later in more detail with reference to FIG. 4.

The support plate 53 may support the pins 51. The support plate 53 may have, but is not limited to, a circular plate shape when viewed in a plan view. The weight sensing sensor 7 may be located under the support plate 53.

The separation plate 8 may surround the measurement stage 5 when viewed in a plan view. The separation plate 8 may provide a fluid movement hole 8_h_. The support plate 53 may be disposed in the fluid movement hole 8_h_. The separation plate 8 may be spaced outward and away from the support plate 53. Thus, a fluid on the support plate 53 may move to the air outlet 1_ae_ through the fluid movement hole 8_h_.

The weight sensing sensor 7 may be configured to sense a weight of a substrate disposed on the measurement stage 5. In some embodiments, the weight sensing sensor 7 may be located under the measurement stage 5. More particularly, the weight sensing sensor 7 may support the measurement stage 5. The weight sensing sensor 7 may be connected to the controller C. Information (or data) on the weight of the substrate sensed by the weight sensing sensor 7 may be transmitted to the controller C. The weight sensing sensor 7 may include at least one of various components capable of sensing a weight. For example, the weight sensing sensor 7 may include a load cell. However, embodiments are not limited thereto, and in certain embodiments, the weight sensing sensor 7 may include another kind of a sensor.

The filter FT may be located below the air inlet 1_ah_. More particularly, the filter FT may be located between the air inlet 1_ah_ and the measurement stage 5. Air provided in the measurement space 1_h_ through the air inlet 1_ah_ may be filtered by the filter FT and then may move onto the measurement stage 5.

The inlet damper DP1 may be configured to selectively open and close the air inlet 1_ah_. The inlet damper DP1 may be coupled directly to the measurement chamber 1. In some embodiments, the inlet damper DP1 may be coupled to an inlet duct (not indicated by a reference designator) extending from the measurement chamber 1.

The outlet damper DP2 may be configured to selectively open and close the air outlet 1_ae_. The outlet damper DP2 may be coupled directly to the measurement chamber 1. In some embodiments, the outlet damper DP2 may be coupled to an outlet duct (not indicated by a reference designator) extending from the measurement chamber 1.

The first differential pressure sensor PS1 and the second differential pressure sensor PS2 may be configured to measure a difference in pressure between the air inlet 1_ah_ and the air outlet 1_ae_. To achieve this measurement, the first differential pressure sensor PS1 may be disposed adjacent to the air inlet 1_ah_. In some embodiments, as illustrated in FIG. 3, the first differential pressure sensor PS1 may be disposed in the air inlet 1_ah_. In some embodiments, the second differential pressure sensor PS2 may be disposed adjacent to the air outlet 1_ae_. In some embodiments, as illustrated in FIG. 3, the second differential pressure sensor PS2 may be disposed in the air outlet 1_ae_. The first differential pressure sensor PS1 and the second differential pressure sensor PS2 may constitute a differential pressure gauge. The inlet damper DP1, the outlet damper DP2, and the differential pressure gauge may be connected to the controller C. For example, the first differential pressure sensor PS1 and the second differential pressure sensor PS2 may be connected to the controller C. The differential pressure gauge may include at least one of various components capable of measuring a pressure. For example, the differential pressure gauge may include a primary pressure gauge such as a manometer and/or a barometer. In some embodiments, the differential pressure gauge may include a secondary pressure gauge such as a bourdon tube pressure gauge. However, embodiments are not limited thereto, and in certain embodiments, the differential pressure gauge may include another kind of a pressure gauge capable of measuring a pressure of a fluid. In some embodiments, the differential pressure gauge may measure the pressure under control of the controller C.

Figure 4:
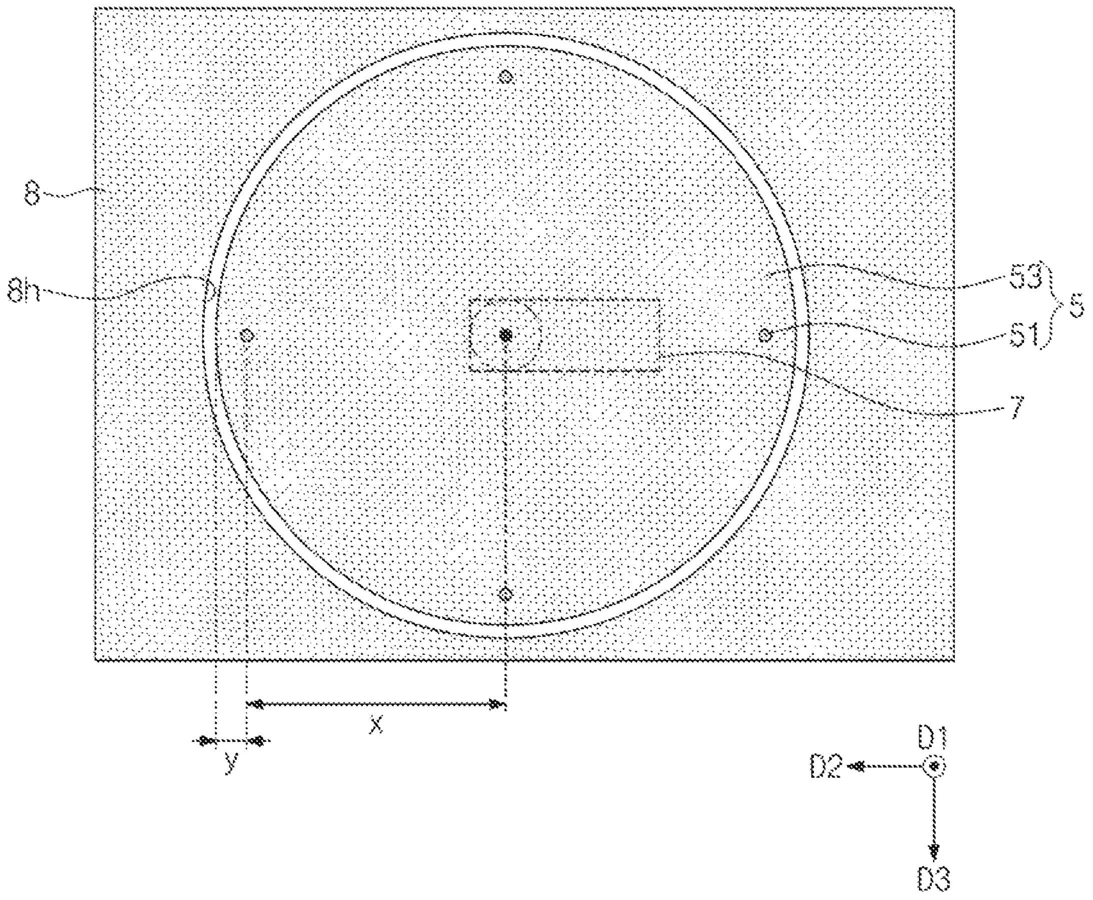
FIG. 4 is a plan view illustrating a substrate weight measurement apparatus according to some embodiments.

FIG. 4 is a plan view illustrating a substrate weight measurement apparatus according to some embodiments.

Referring to FIG. 4, the plurality of pins 51 may be spaced apart from a center of the measurement stage 5 by a first distance x. For example, the first distance x may be about 100 mm or more. The pins 51 may be spaced apart from a circumference of the measurement stage 5 by a second distance y. For example, the second distance y may be about 50 mm or less.

The pins 51 may be provided in plurality. For example, as illustrated in FIG. 4, four pins 51 may be provided. The plurality of pins 51 may be spaced apart from each other in the horizontal directions, i.e., directions cross the support plate 53, as illustrated in FIG. 4. However, a single pin 51 will be mainly described hereinafter for the purpose of ease and convenience in explanation.

Figure 5:
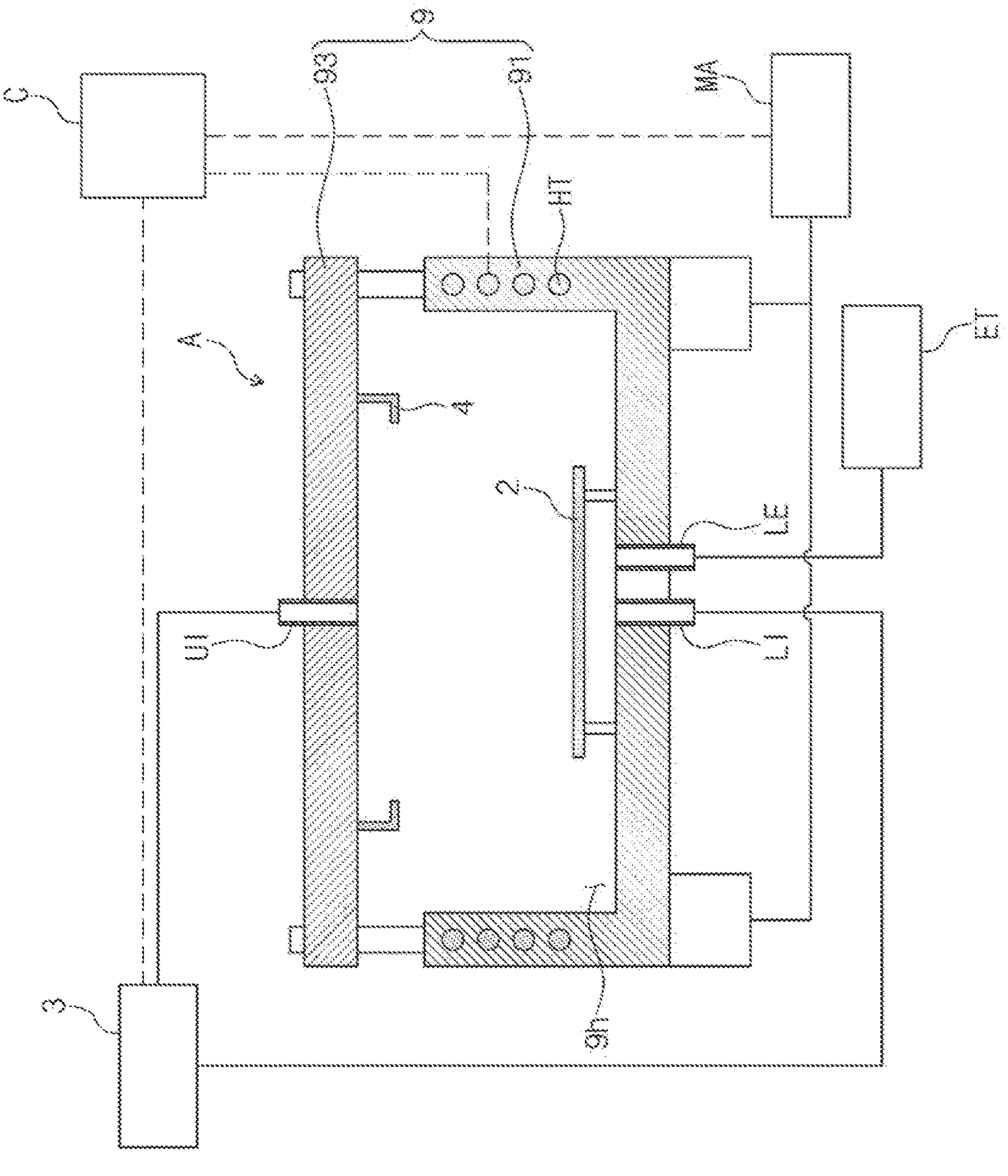
FIG. 5 is a cross-sectional view illustrating a drying apparatus according to some embodiments.

FIG. 5 is a cross-sectional view illustrating a drying apparatus according to some embodiments.

Referring to FIG. 5, the drying apparatus A may be configured to dry a substrate. More particularly, liquid on a substrate may be removed from the substrate in the drying apparatus A. The drying apparatus A may include the drying chamber 9, a drying heater HT, a drying chuck 4, a blocking plate 2, a chamber driving unit MA, and an exhaust tank ET.

The drying chamber 9 may provide a drying space 9_h_. The drying chamber 9 may include a lower chamber 91 and an upper chamber 93. The lower chamber 91 may be spaced downward from the upper chamber 93. The drying space 9_h_ may be provided between the lower chamber 91 and the upper chamber 93. The lower chamber 91 may be vertically movable. For example, the lower chamber 91 may be moved upward by the chamber driving unit MA and thus may be coupled to the upper chamber 93. The lower chamber 91 and the upper chamber 93 may be coupled to each other to isolate the drying space 9*h* from the outside. An upper inlet UI may be provided at the upper chamber 93. The upper inlet UI may be connected to the drying fluid supply 3. The drying fluid may be supplied from the drying fluid supply 3 into the drying space 9*h* through the upper inlet UI. A lower inlet LI and a lower outlet LE may be provided at the lower chamber 91. The lower inlet LI may be connected to the drying fluid supply 3. The drying fluid may be supplied from the drying fluid supply 3 into the drying space 9*h* through the lower inlet LI. The lower outlet LE may be connected to the exhaust tank ET. The drying fluid, etc. may be exhausted to the outside through the lower outlet LE.

The drying heater HT may be coupled to the drying chamber 9. The drying heater HT may be configured to heat the drying space 9*h*. The drying fluid supplied in the drying space 9*h* may be maintained in the supercritical state by the heating of the drying heater HT.

The drying chuck 4 may be connected to the upper chamber 93. The drying chuck 4 may be spaced downward from the upper chamber 93. A substrate may be disposed or placed on the drying chuck 4. In other words, the drying chuck 4 may support the substrate.

The blocking plate 2 may be connected to the lower chamber 91. The blocking plate 2 may be spaced upward from the lower inlet LI and the lower outlet LE by a certain distance. The blocking plate 2 may block the flowing of the drying fluid. For example, the blocking plate 2 may prevent the drying fluid supplied through the lower inlet LI from being directly supplied or sprayed to a substrate on the drying chuck 4. The chamber driving unit MA may be connected to the lower chamber 91. The chamber driving unit MA may be configured to vertically move the lower chamber 91. By the chamber driving unit MA, the lower chamber 91 may be coupled to the upper chamber 93 or may be separated from the upper chamber 93. To achieve this, the chamber driving unit MA may include an actuator (e.g., a motor). The exhaust tank ET may be connected to the lower outlet LE. The drying fluid exhausted through the lower outlet LE may move to the exhaust tank ET.

Figure 6:
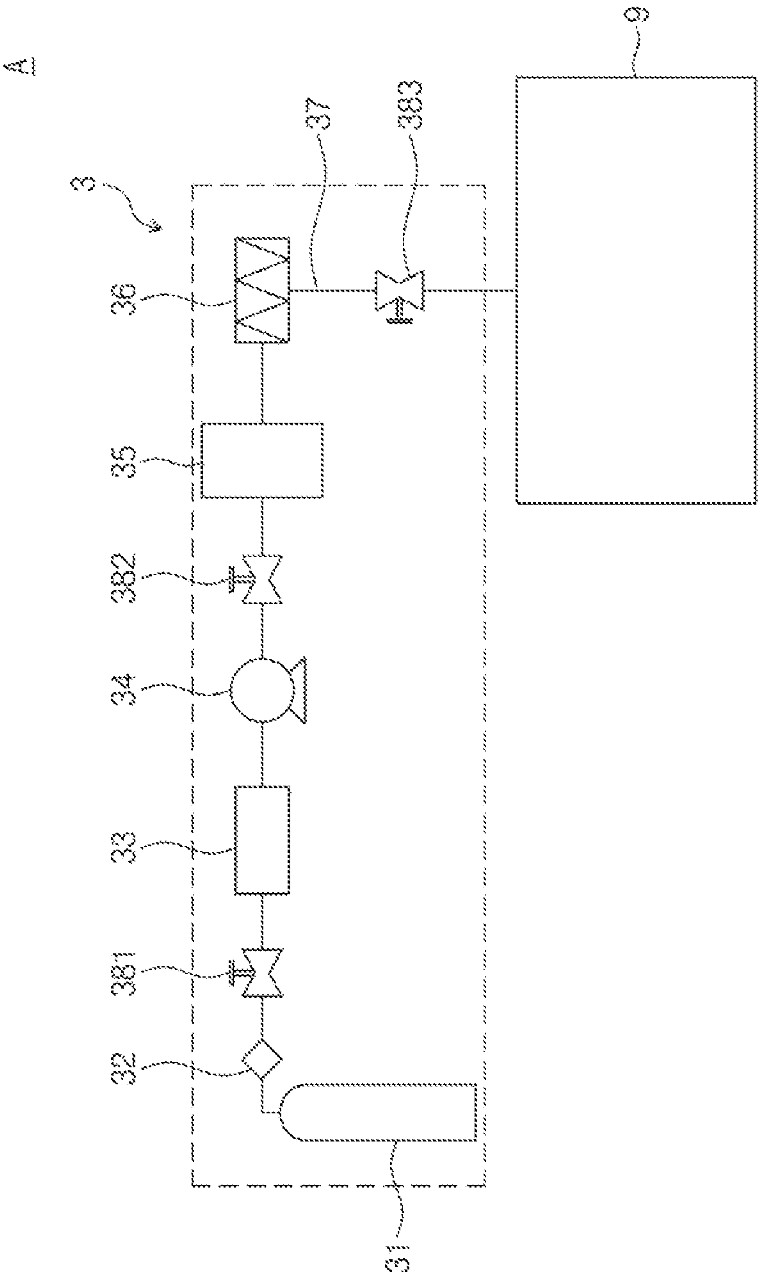
FIG. 6 is a schematic view illustrating a drying fluid supply unit according to some embodiments.

FIG. 6 is a schematic view illustrating a drying fluid supply according to some embodiments.

Referring to FIG. 6, the drying fluid supply 3 may include a drying fluid supply source 31, a drying fluid line 37, a supply filter 32, a first valve 381, a condenser 33, a pump 34, a second valve 382, a tank 35, a heater 36, and a third valve 383.

The drying fluid supply source 31 may be configured to supply the drying fluid. More particularly, the drying fluid supply source 31 may store and supply a fluid, to be formed into the supercritical fluid, in a gaseous state. In the case in which the drying fluid is the $CO_2$ supercritical fluid, the drying fluid supply source 31 may store gaseous $CO_2$. A temperature of the gaseous $CO_2$ supplied by the drying fluid supply source 31 may range from about 10° C. to about 30° C. In addition, a pressure of the gaseous $CO_2$ supplied by the drying fluid supply source 31 may range from about 4 MPa to about 6 MPa. The drying fluid supplied from the drying fluid supply source 31 may move along the drying fluid line 37.

The drying fluid line 37 may provide a path through which the drying fluid supplied from the drying fluid supply source 31 is provided into the drying chamber 9. The supply filter 32 may be located on the drying fluid line 37. The supply filter 32 may filter a foreign material in the drying fluid. The first valve 381 may open and close a flow path between the supply filter 32 and the condenser 33 to control movement of the drying fluid.

The condenser 33 may cool the gaseous $CO_2$ supplied from the drying fluid supply source 31. Thus, the gaseous $CO_2$ may be liquefied in the condenser 33. For example, a temperature of the $CO_2$ liquefied in the condenser 33 may range from about 0° C. to about 6° C. In addition, a pressure of the $CO_2$ liquefied in the condenser 33 may range from about 4 MPa to about 6 MPa.

The pump 34 may be configured to increase the pressure of the drying fluid liquefied through the condenser 33. For example, the pressure of the $CO_2$ liquefied in the condenser 33 may become in a range of about 15 MPa to about 25 MPa by the pump 34. In addition, the temperature of the $CO_2$ liquefied in the condenser 33 may become in a range of about 15° C. to about 25° C. while passing through the pump 34. The second valve 382 may open and close a flow path between the pump 34 and the tank 35 to control movement of the drying fluid. The tank 35 may store the drying fluid compressed by the pump 34.

The heater 36 may be configured to heat the drying fluid moving along the drying fluid line 37. More particularly, the heater 36 may heat the $CO_2$ in a liquid state, which is compressed by the pump 34. Thus, the $CO_2$ in the liquid state may become in a supercritical state. The $CO_2$ in the supercritical state, which is formed by the heating of the heater 36, may be in a high-temperature and high-pressure state. For example, a temperature of the $CO_2$ in the supercritical state through the heater 36 may range from about 60° C. to about 90° C. In addition, a pressure of the $CO_2$ in the supercritical state through the heater 36 may range from about 15 MPa to about 25 MPa. The third valve 383 may control movement of the $CO_2$ in the supercritical state through the heater 36. The $CO_2$ in the supercritical state may flow into the drying chamber 9 through the third valve 383.

Figure 7:
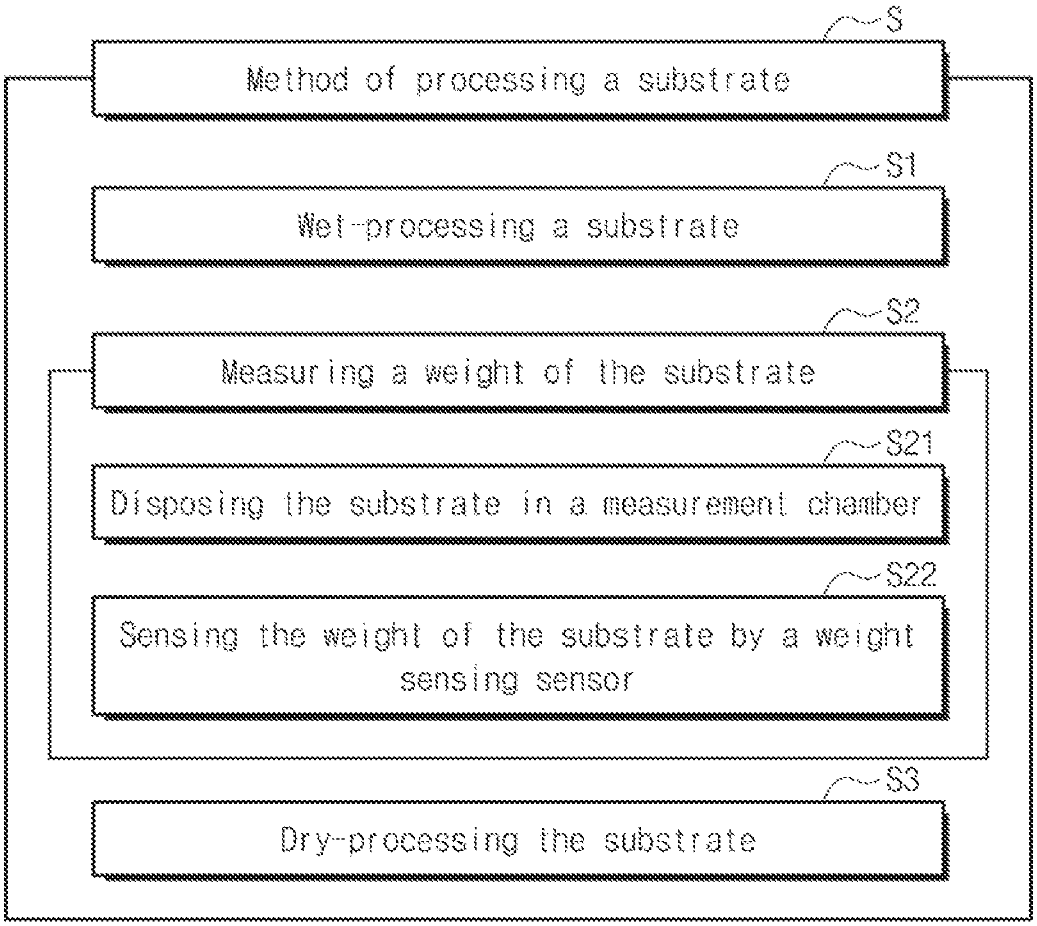
FIG. 7 is a flow chart illustrating a method of processing a substrate according to some embodiments.

FIG. 7 is a flow chart illustrating a method of processing a substrate according to some embodiments.

Referring to FIG. 7, a method of processing a substrate (S) may be provided. The method of processing a substrate (S) may be a method of processing a substrate using the substrate processing apparatus P (see FIG. 1) described with reference to FIGS. 1 to 6. The method of processing a substrate (S) may include wet-processing a substrate (51), measuring a weight of the substrate (S2), and dry-processing the substrate (S3).

The measuring of the weight of the substrate (S2) may include disposing the substrate in a measurement chamber (S21) and sensing the weight of the substrate by a weight sensing sensor (S22).

Hereinafter, the method of processing a substrate (S) in FIG. 7 will be described in detail with reference to FIGS. 8 to 17.

FIGS. 8 to 17 are views illustrating the method of processing a substrate according to the flow chart of FIG. 7.

Figure 8:
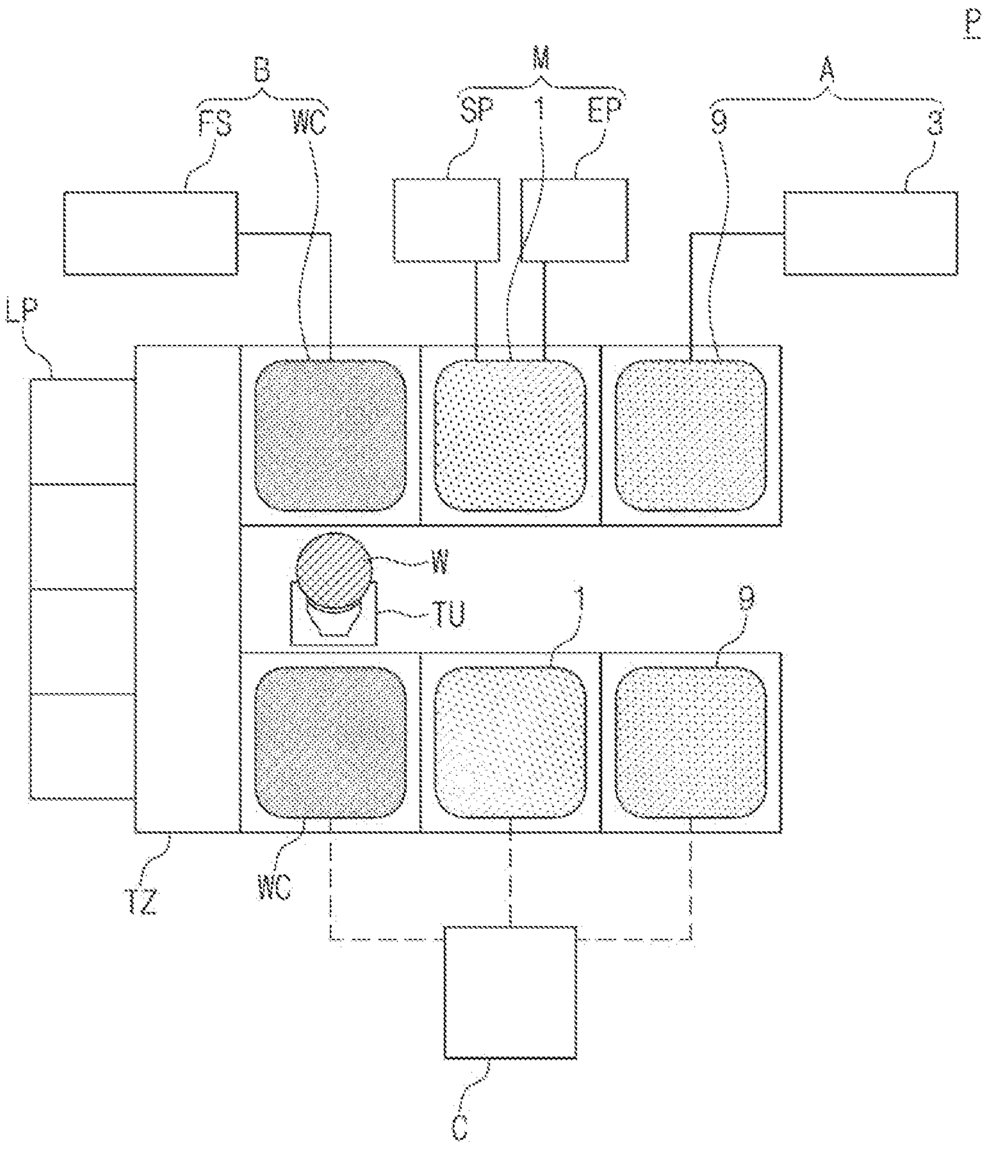
FIGS. 8 to 17 are views illustrating the method of processing a substrate according to the flow chart of FIG. 7, according to some embodiments.
Figure 9:
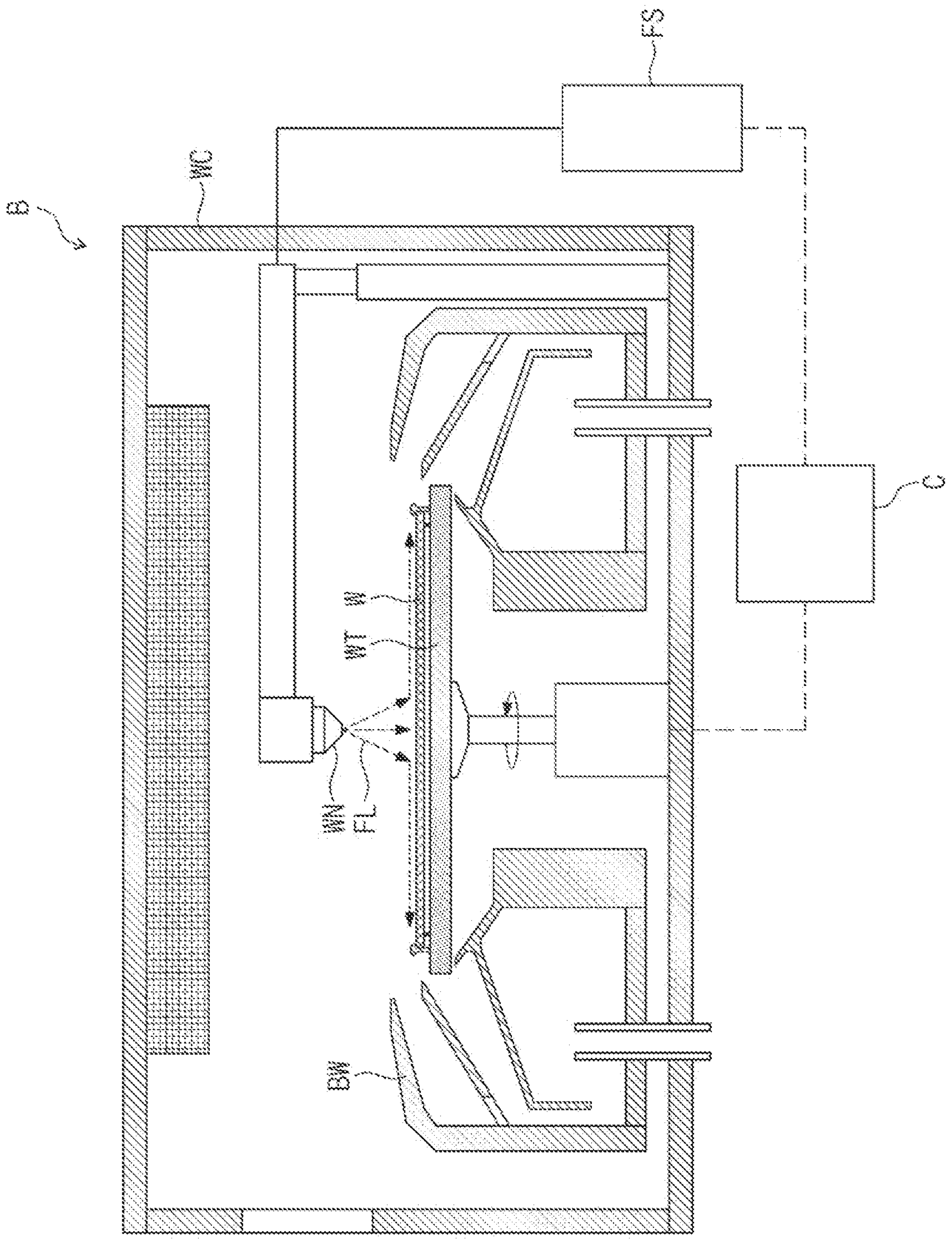

Referring to FIGS. 8, 9 and 7, the wet-processing of the substrate (51) may include disposing a substrate W in the wet chamber WC. More particularly, the substrate W may be disposed on the wetting stage WT. In a state in which the substrate W is disposed on the wetting stage WT, a fluid FL supplied from the fluid supply FS may be supplied or sprayed onto the substrate W through the wetting nozzle WN. During the supply of the fluid FL from the fluid supply FS, the substrate W may be rotated by the wetting stage WT.

When the substrate W is rotated while supplying or spraying the fluid FL, the fluid FL may be uniformly coated on a top surface of the substrate W.

Figure 10:
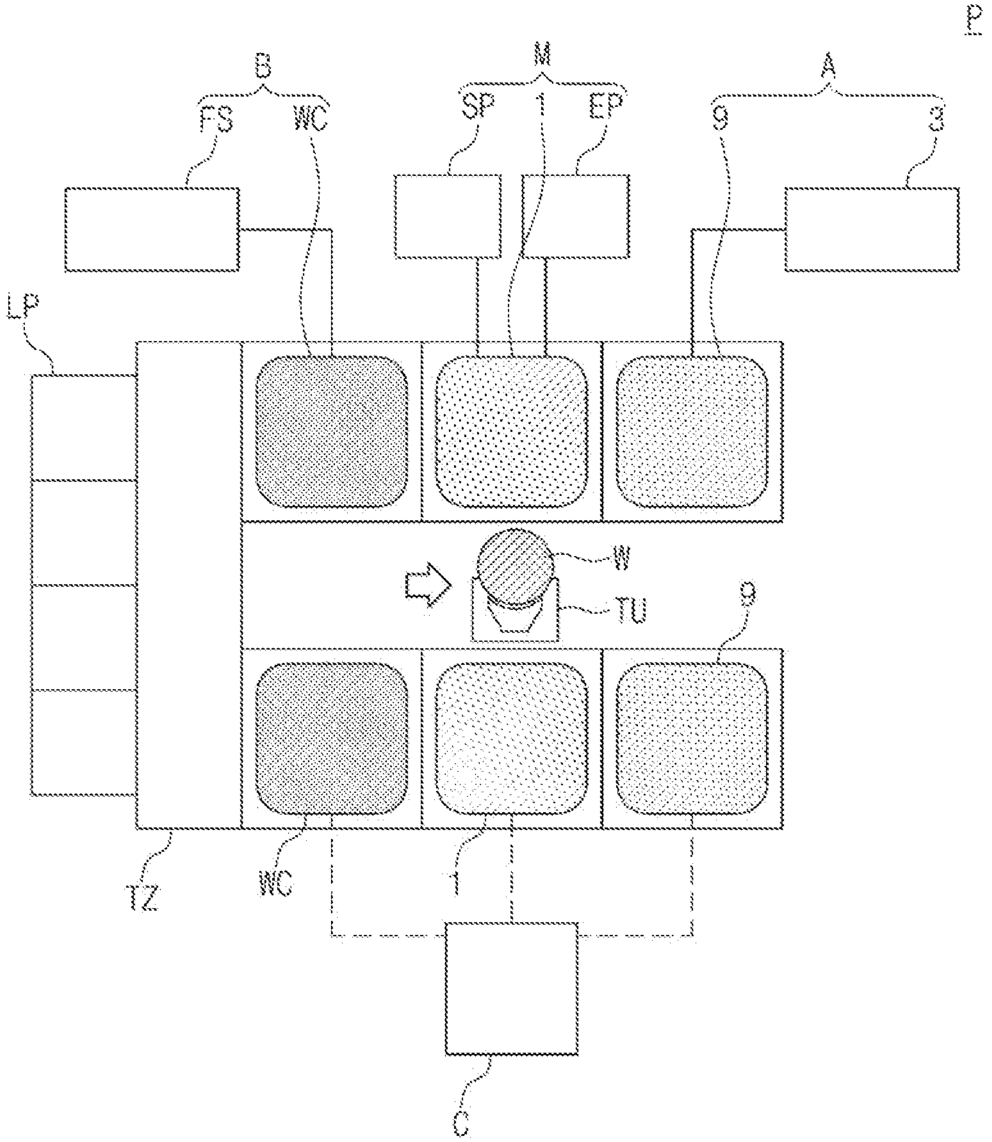
Figure 11:
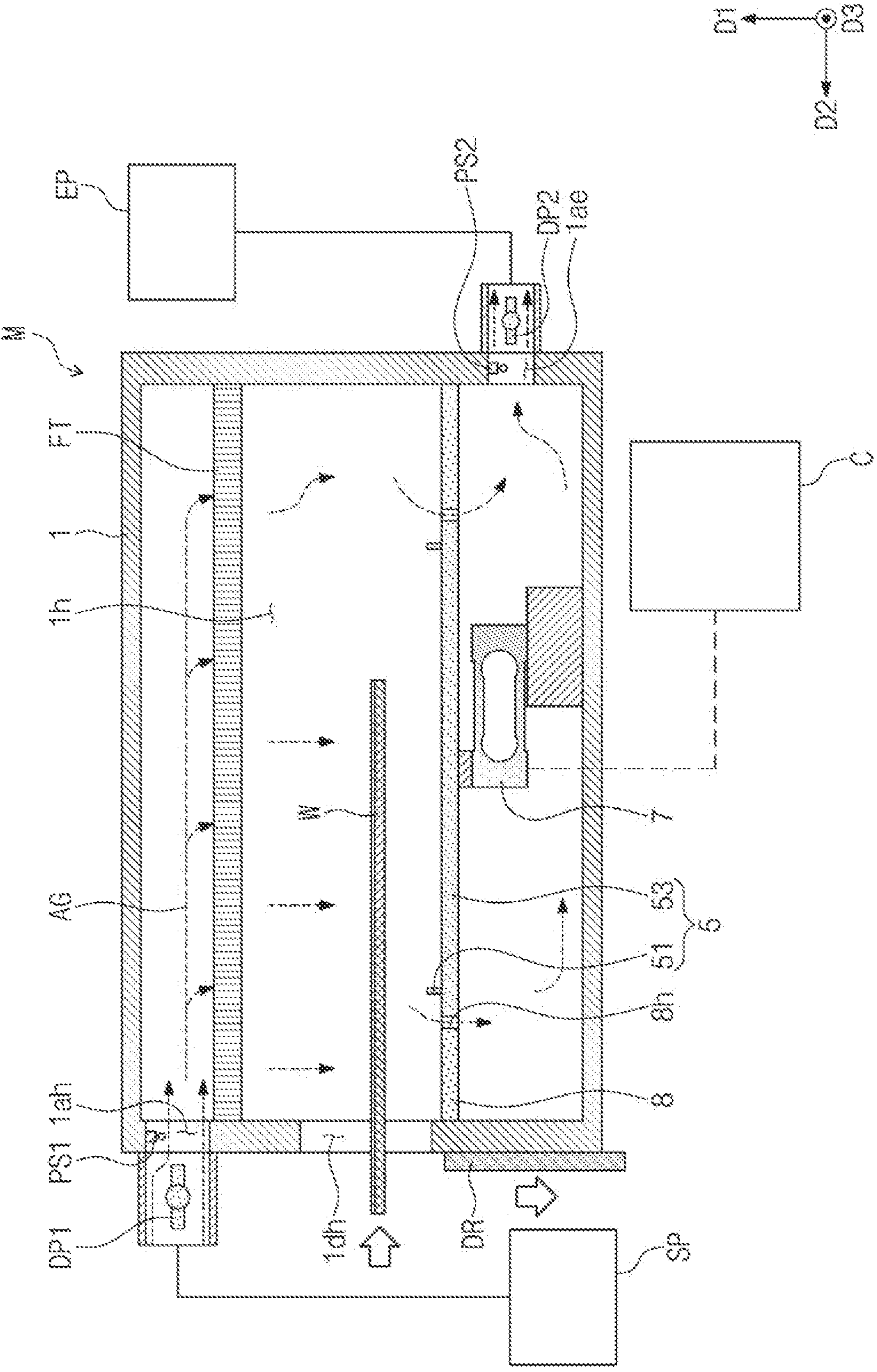

Referring to FIGS. 10, 11 and 7, the disposing of the substrate in the measurement chamber (S21) may include inserting the substrate W, which has passed through the wetting apparatus B, into the measurement chamber 1 by the transfer unit TU. More particularly, the substrate W may be inserted or provided into the measurement space 1*h* through the insertion hole 1*dh*. During the transfer of the substrate from the wetting apparatus B to the measurement chamber 1, the fluid still may be coated on the substrate W.

The measuring of the weight of the substrate (S2) may further include supplying air AG into the measurement space 1*h*. For example, before the substrate W is disposed on the measurement stage 5, the air AG may be supplied from the air supply SP into the measurement space 1*h* through the air inlet 1*ah*. For this supply, the inlet damper DP1 may be opened. A temperature of the air AG supplied into the measurement space 1*h* may range from about 20° C. to about 27° C. However, embodiments are not limited thereto, and the temperature of the air AG supplied into the measurement space 1*h* may be set to another value in some embodiments.

The measuring of the weight of the substrate (S2) may further include exhausting the air AG of the measurement space 1*h*. For example, before the substrate W is disposed on the measurement stage 5, the air AG may be exhausted from the measurement space 1*h* toward the air exhaust unit EP through the air outlet 1*ae*. For this exhaust, the outlet damper DP2 may be opened.

In the measuring of the weight of the substrate (S2), a pressure of the measurement space 1*h* may be maintained at a value in a certain range. To achieve this maintenance of the range of pressure, the pressure may be measured by the differential pressure gauge. When the pressure of the measurement space 1*h* measured by the differential pressure gauge is higher than the certain range, the air AG of the measurement space 1*h* may be exhausted by the air exhaust unit EP. On the contrary, when the pressure of the measurement space 1*h* measured by the differential pressure gauge is lower than the certain range, the air AG may be supplied into the measurement space 1*h* by the air supply SP. The pressure measurement, the air supply and the air exhaust may be controller by the controller C. By this method, the pressure of the measurement space 1*h* may be maintained in the certain range. In some embodiments, the pressure of the measurement space 1*h* may be maintained at a value not higher than a pressure of the outside space. For example, in some embodiments, the pressure of the measurement space 1*h* may be maintained at a value lower than the pressure of the outside space. Thus, it is possible to prevent the fluid of the measurement space 1*h* from escaping to the outside space.

Figure 12:
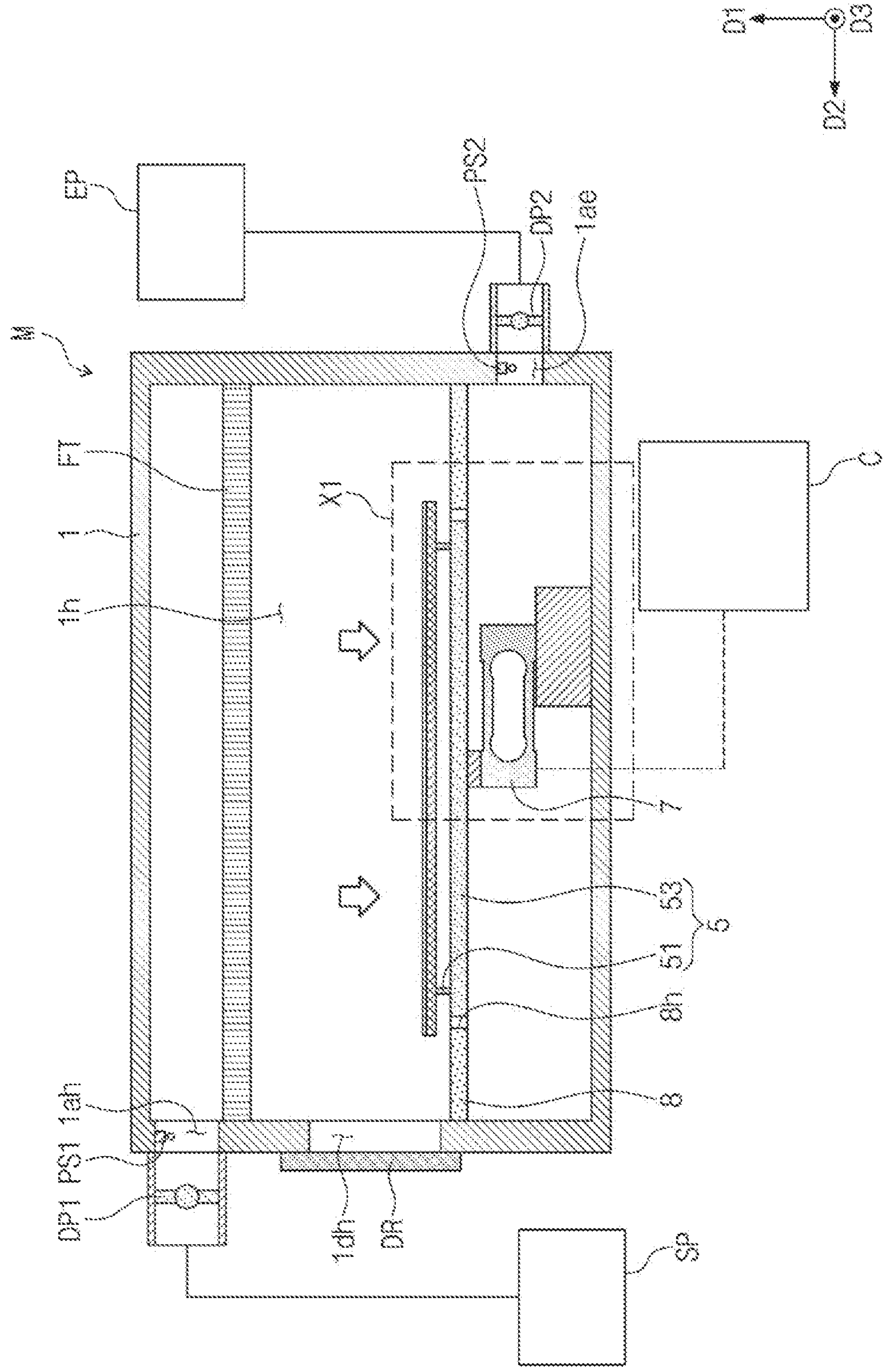

Referring to FIGS. 12 and 7, the disposing of the substrate in the measurement chamber (S21) may include disposing the substrate W on the measurement stage 5. More particularly, the substrate W may be disposed on the plurality of pins 51. The substrate W may be supported by the plurality of pins 51. As discussed above, the plurality of pins 51 may be spaced apart from each other in the horizontal directions, i.e., across the center of the support plate 53 as illustrated in FIG. 4, and thus a portion of the substrate W supported by the plurality of pins 51 may sag down. This sagging will be described later in more detail with reference to FIG. 13.

Figure 13:
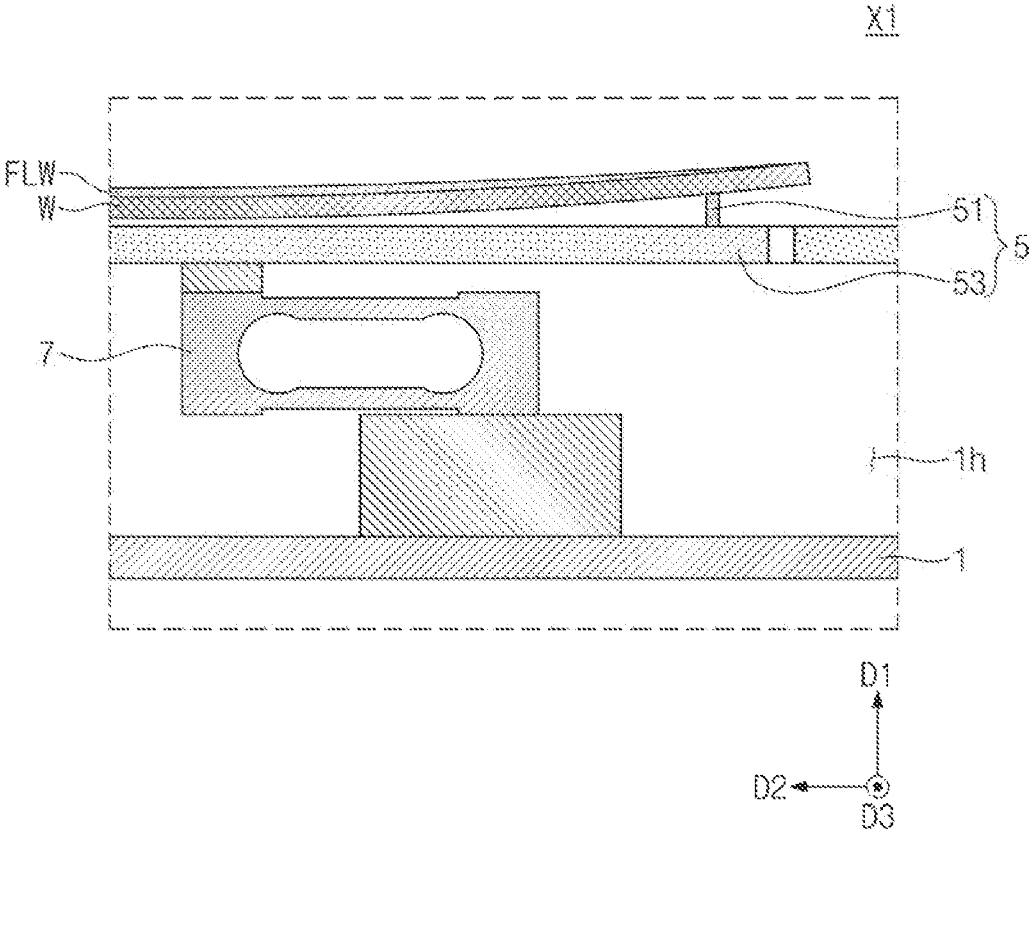

Referring to FIGS. 12, 13 and 7, the measuring of the weight of the substrate (S2) may further include closing the measurement door DR to seal the measurement space 1*h* from the outside space. In other words, the measurement door DR may close the insertion hole 1*dh* to seal the measurement space 1*h*.

The sensing of the weight of the substrate by the weight sensing sensor (S22) may include sensing a weight of the substrate W on the measurement stage 5 by the weight sensing sensor 7. Since the pins 51 support the substrate W in the state of being spaced apart from each other in the horizontal directions, a central portion of the substrate W may sag down slightly. Thus, it is possible to prevent a fluid FLW coated on the top surface of the substrate W from flowing to the outside beyond an edge of the substrate W. The weight sensing sensor 7 may sense a weight of the substrate W and the fluid FLW. Information (or data) on the weight sensed by the weight sensing sensor 7 may be transmitted to the controller C.

Figure 14:
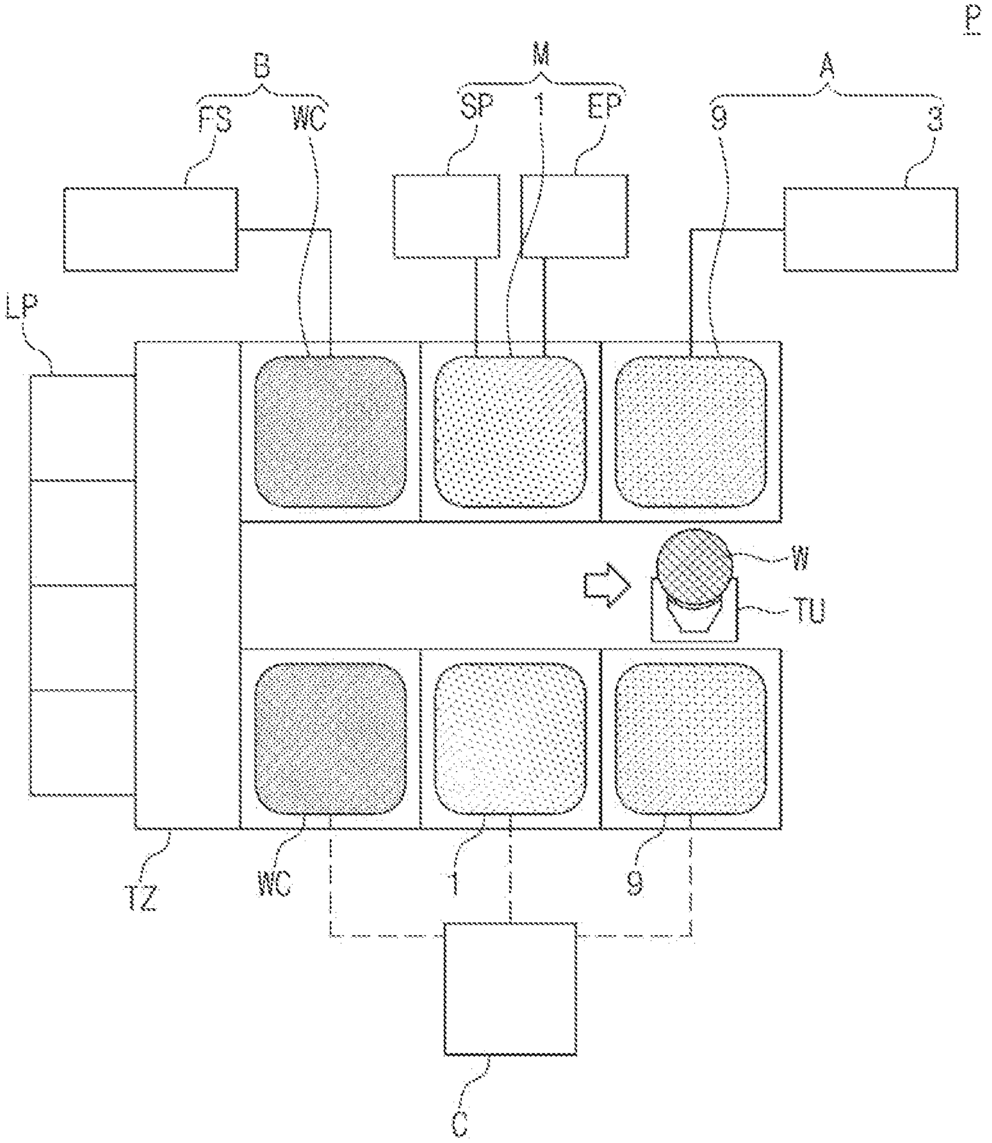
Figure 15:
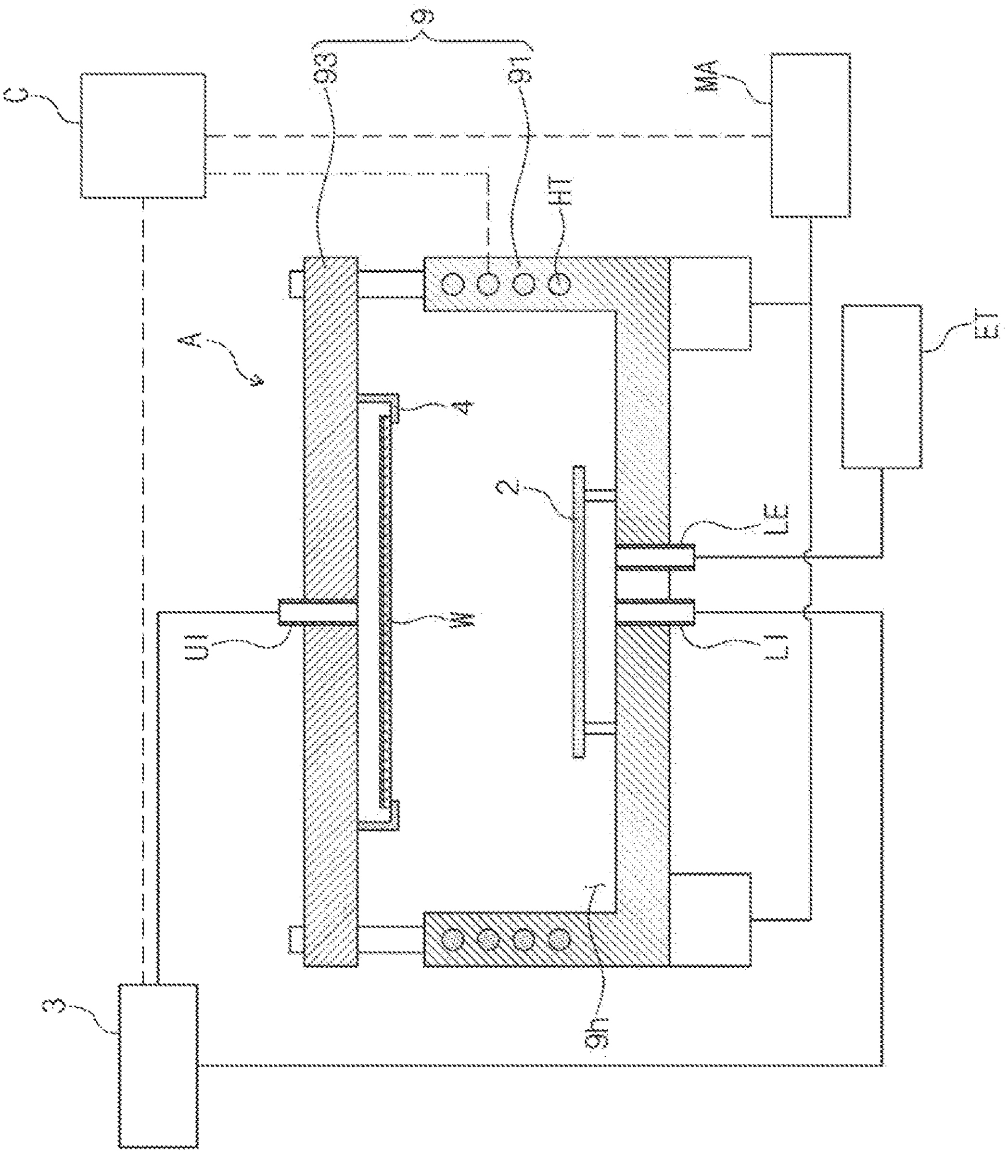

Referring to FIGS. 14, 15 and 7, the dry-processing of the substrate (S3) may include disposing the substrate W, which has passed through the substrate weight measurement apparatus M, in the drying chamber 9. The substrate W may be disposed on the drying chuck 4.

Figure 16:
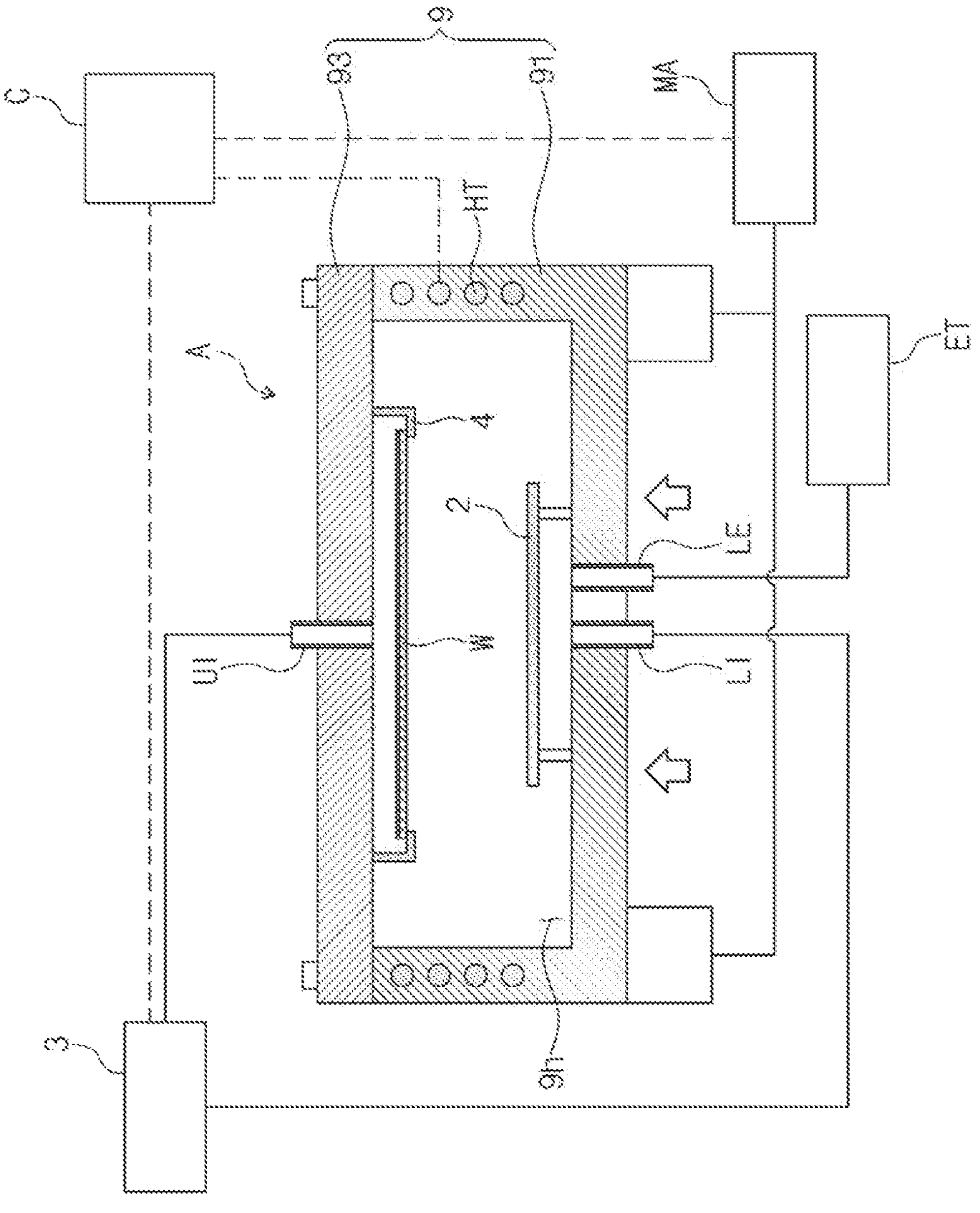

Referring to FIGS. 16 and 7, the dry-processing of the substrate (S3) may further include sealing the drying chamber 9. In the state in which the substrate W is disposed on the drying chuck 4, the lower chamber 91 may be coupled to the upper chamber 93 to seal the drying space 9*h*.

Figure 17:
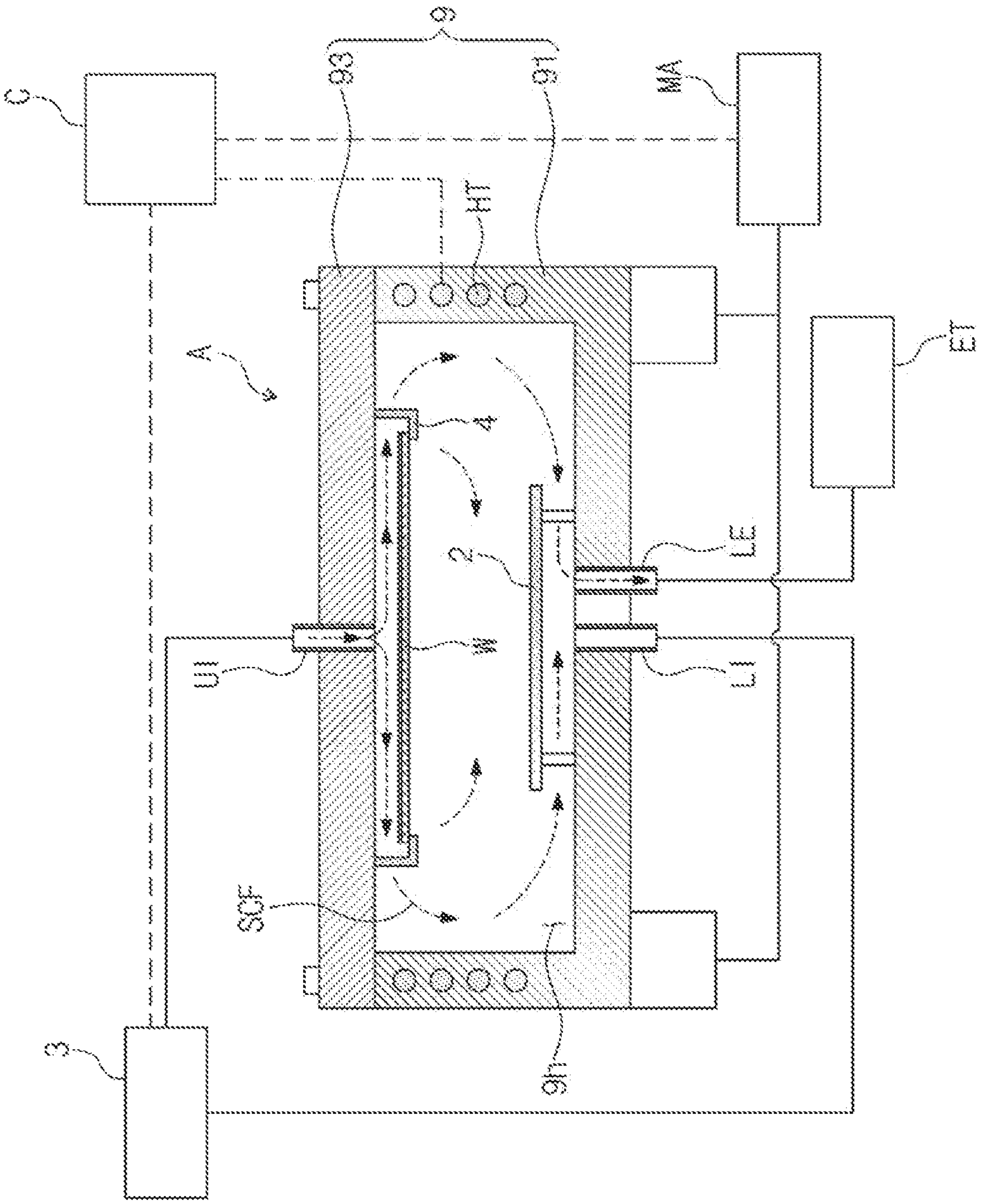

Referring to FIGS. 17 and 7, the dry-processing of the substrate (S3) may further include supplying a supercritical fluid SCF into the drying chamber 9. The supercritical fluid SCF supplied from the drying fluid supply unit 3 into the drying space 9*h* may remove the fluid coated on the top surface of the substrate W from the substrate W. Thus, the substrate W may be dried and/or cleaned.

When the weight of the substrate W measured by the substrate weight measurement apparatus M (see FIG. 12) is out of the certain range, a condition of the supercritical fluid SCF supplied into the drying chamber 9 may be changed. For example, when the weight of the substrate W is less than a certain value, a flow rate and/or a supply time of the supercritical fluid SCF supplied into the drying chamber 9 may be reduced. On the contrary, when the weight of the substrate W is greater than a certain value, the flow rate and/or the supply time of the supercritical fluid SCF supplied into the drying chamber 9 may be increased. Since an exact wetting amount of the substrate W is measured or determined in the substrate weight measurement apparatus M, a process recipe in the drying chamber 9 may be changed or adjusted to perform an optimal drying process.

According to the substrate weight measurement apparatus, the substrate processing apparatus including the same and the method of processing a substrate using the same in the embodiments, the weight of the substrate may be measured in a separate chamber (i.e., the measurement chamber), and thus the wetting amount of the substrate may be accurately or exactly determined. More particularly, since the weight of the substrate is measured in a state in which the pressure, humidity and/or temperature of the measurement space is maintained at a certain level by supplying the air into the measurement chamber, it is possible to reduce the amount of the fluid evaporated from the substrate in the measurement of the weight of the substrate. Thus, the weight of the wetted substrate may be accurately or exactly measured.

According to the substrate weight measurement apparatus, the substrate processing apparatus including the same and the method of processing a substrate using the same in the embodiments, the evaporation of the fluid from the substrate in the measurement of the weight of the substrate may be prevented to maintain the substrate in a wetted state. In addition, since the central portion of the substrate is sagging down in the measurement of the weight of the substrate, it is possible to prevent the fluid on the substrate from flowing from the substrate to the outside. Thus, the substrate may be maintained in the wetted state. As a result, it is possible to prevent the substrate from being naturally dried before entering the drying chamber. Since the natural drying of the substrate is prevented, contamination of the substrate may be prevented.

According to the substrate weight measurement apparatus, the substrate processing apparatus including the same and the method of processing a substrate using the same in the embodiments, the weight of the substrate may be measured in the separate measurement chamber, and thus it is possible to prevent a foreign material evaporated from the substrate from escaping to the outside. In particular, when the pressure of the measurement space is lower than the pressure of the outside space, it is possible to prevent external apparatuses from being contaminated by the foreign material evaporated from the substrate.

Figure 18:
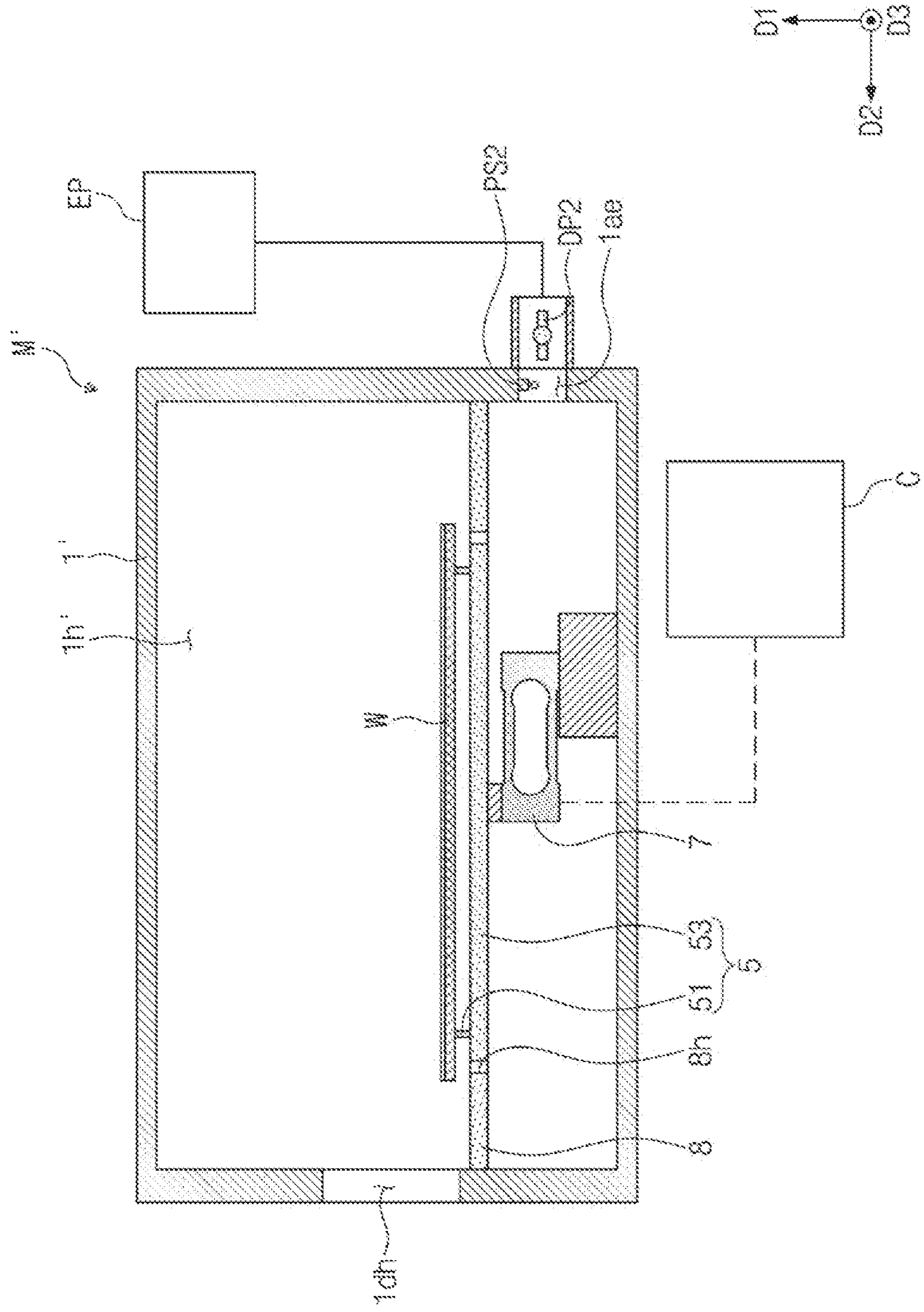
FIG. 18 is a cross-sectional view illustrating a substrate weight measurement apparatus according to some embodiments.

FIG. 18 is a cross-sectional view illustrating a substrate weight measurement apparatus according to some embodiments.

Hereinafter, the descriptions to the same or similar features and components as mentioned with reference to FIGS. 1 to 17 will be omitted for the purpose of ease and convenience in explanation and for conciseness.

Referring to FIG. 18, a substrate weight measurement apparatus M' may be provided. The substrate weight measurement apparatus M' may include a measurement chamber 1'. The measurement chamber 1' may provide a measurement space 1*h*'. However, unlike FIG. 3, the measurement chamber 1' may not provide an air inlet. That is, in the measurement chamber 1', the air inlet may be omitted. In addition, the substrate weight measurement apparatus M' may not include a measurement door. That is, in the substrate weight measurement apparatus M', the measurement door may be omitted. Thus, the measurement space 1*h*' may be exposed to the outside space in a state in which a substrate W is disposed on the measurement stage 5. Air of the measurement space 1*h*' may be exhausted through the air outlet 1*ae* by the air exhaust unit EP to control a pressure of the measurement space 1*h*'. In addition, a foreign material occurring from the substrate W may be exhausted to the air exhaust unit EP through the air outlet 1*ae* to prevent the foreign material from escaping to the outside space of the measurement chamber 1'.

Figure 19:
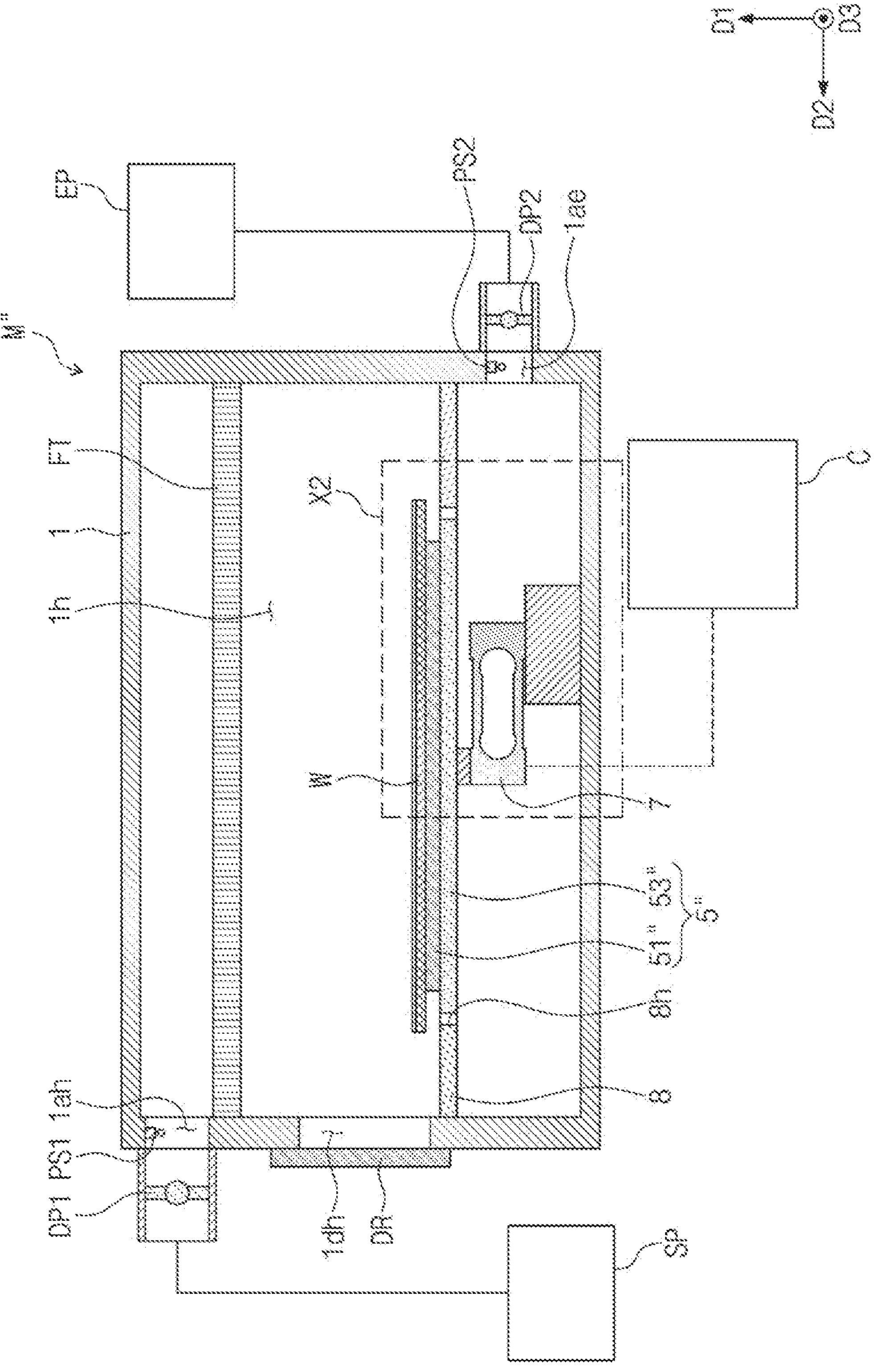
FIG. 19 is a cross-sectional view illustrating a substrate weight measurement apparatus according to some embodiments.
Figure 20:
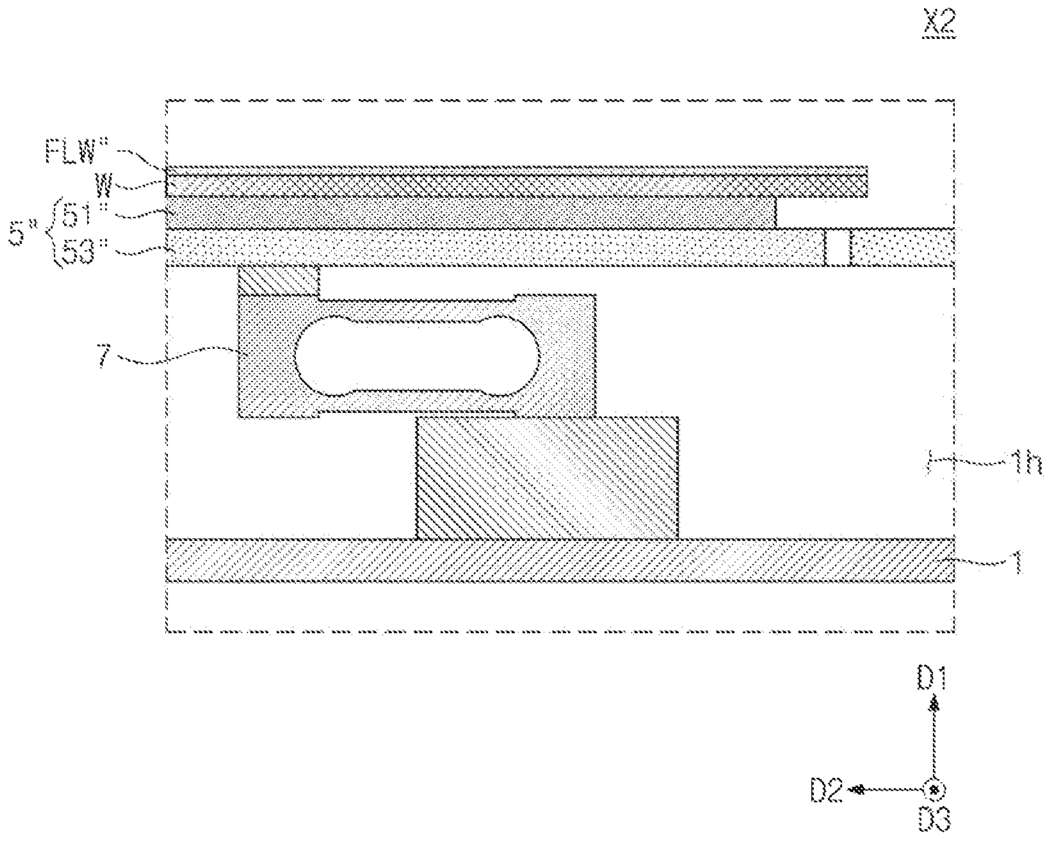
FIG. 20 is an enlarged cross-sectional view of a region 'X2' of FIG. 19.

FIG. 19 is a cross-sectional view illustrating a substrate weight measurement apparatus according to some embodiments, and FIG. 20 is an enlarged cross-sectional view of a region 'X2' of FIG. 19.

Hereinafter, the descriptions to the same or similar features and components as mentioned with reference to FIGS. 1 to 18 will be omitted for the purpose of ease and convenience in explanation and for conciseness.

Referring to FIGS. 19 and 20, a substrate weight measurement apparatus M" may be provided. The substrate weight measurement apparatus M" may include a measurement stage 5". The measurement stage 5" may include an upper plate 51" and a support plate 53". That is, in the substrate weight measurement apparatus M", the plurality of pins 51 may be omitted. The upper plate 51" may be located on the support plate 53". The upper plate 51" may support a substrate W. Here, when a diameter of the upper plate 51" is great, the substrate W supported by the upper plate 51" may not sag down. A fluid FLW" on the substrate W may be uniformly distributed on the substrate W. Thus, the substrate W may be maintained in a uniformly wetted state.

According to the substrate weight measurement apparatus, the substrate processing apparatus including the same and the method of processing a substrate using the same in the embodiments, the weight of the wetted substrate may be accurately or exactly measured.

According to the substrate weight measurement apparatus, the substrate processing apparatus including the same and the method of processing a substrate using the same in the embodiments, the evaporation of the fluid from the substrate may be reduced during the measurement of the weight of the substrate.

According to the substrate weight measurement apparatus, the substrate processing apparatus including the same and the method of processing a substrate using the same in the embodiments, the wetting amount of the substrate may be maintained at a certain level.

According to the substrate weight measurement apparatus, the substrate processing apparatus including the same and the method of processing a substrate using the same in the embodiments, it is possible to prevent another apparatus from being contaminated by the fluid evaporated from the substrate.

While some embodiments have been particularly shown and described, it will be understood by one of ordinary skill in the art that variations in form and detail may be made therein without departing from the spirit and scope of the attached claims.

What is claimed is:

1. A substrate processing apparatus comprising:

a wetting apparatus configured to supply a fluid onto a substrate;

a substrate weight measurement apparatus configured to measure a weight of the substrate which has passed through the wetting apparatus and which has thereon fluid from only the wetting apparatus; and a drying apparatus configured to dry the substrate which has passed through the substrate weight measurement apparatus, wherein the substrate weight measurement apparatus comprises:

a measurement chamber providing a measurement space which is maintained at a pressure in a certain range;

a measurement stage in the measurement chamber; and a weight sensing sensor configured to sense the weight of the substrate disposed on the measurement stage while the measurement space is maintained at the pressure in the certain range.

2. The substrate processing apparatus of claim 1, wherein the measurement stage comprises a plurality of pins extending vertically, and wherein the plurality of pins are spaced apart from each other in directions orthogonal to a vertical direction and are configured to support the substrate.

3. The substrate processing apparatus of claim 2, wherein each of the plurality of pins is spaced apart from a center of the measurement stage by 100 mm or more.

4. The substrate processing apparatus of claim 2, wherein the weight sensing sensor comprises a load cell, and wherein the load cell is located below the plurality of pins.

5. The substrate processing apparatus of claim 1, wherein the measurement chamber has:

an insertion hole through which the substrate is passed; and an air outlet spaced apart from the insertion hole, the air outlet configured to exhaust air in the measurement space.

6. The substrate processing apparatus of claim 5, wherein the measurement chamber has an air inlet that is spaced apart from the insertion hole and the air outlet and that connects the measurement space to an outside space that is outside of the measurement chamber.

7. The substrate processing apparatus of claim 6, wherein the substrate weight measurement apparatus comprises an air supply configured to supply air into the measurement space, and wherein the air supply is connected to the air inlet.

8. The substrate processing apparatus of claim 1, wherein the drying apparatus comprises:

a drying chamber; and a drying fluid supply configured to supply a supercritical fluid into the drying chamber.

9. The substrate processing apparatus of claim 1, wherein the wetting apparatus comprises:

a wet chamber; and a fluid supply configured to supply the fluid into the wet chamber.

10. The substrate processing apparatus of claim 1, wherein the substrate weight measurement apparatus is not configured to supply a fluid to the substrate.

11. The substrate processing apparatus of claim 1, wherein the measurement stage comprises a plurality of pins extending vertically, and wherein the plurality of pins are spaced apart from each other in a first direction orthogonal to a vertical direction and are spaced apart from each other in a second direction intersecting the first direction and orthogonal to the vertical direction, and wherein the plurality of pins are configured to support the substrate.

12. The substrate processing apparatus of claim 11, wherein the plurality of pins comprise four pins, a first two pins of the four pins are spaced apart from a center of the measurement stage in the first direction, and a second two pins of the four pins are spaced apart from the center of the measurement stage in the second direction.

13. The substrate processing apparatus of claim 12, wherein the plurality of pins support the substrate such that the substrate sags in the vertical direction at a center of the substrate between the between the first two pins and between the second two pins.

14. The substrate processing apparatus of claim 1, wherein the pressure of the measurement space is maintained at a value not higher than a pressure of an outside space outside of the measurement chamber.

15. The substrate processing apparatus of claim 1, wherein the pressure is a lower pressure than a pressure of an outside space outside of the measurement chamber.

16. A substrate processing apparatus comprising:

a wetting apparatus configured to supply a fluid onto a substrate;

a substrate weight measurement apparatus that is not configured to supply a fluid to the substrate and that is configured to measure a weight of the substrate which has passed through the wetting apparatus; and a drying apparatus configured to dry the substrate which has passed through the substrate weight measurement apparatus, wherein the substrate weight measurement apparatus comprises:

a measurement chamber providing a measurement space which is maintained at a pressure within a certain range;

a measurement stage in the measurement chamber; and a weight sensing sensor configured to sense the weight of the substrate disposed on the measurement stage while the measurement space is maintained at the pressure within the certain range.

17. The substrate processing apparatus of claim 16, wherein the pressure of the measurement space is maintained at a value not higher than a pressure of an outside space outside of the measurement chamber.

18. The substrate processing apparatus of claim 16, wherein the pressure is a lower pressure than a pressure of an outside space outside of the measurement chamber.

19. A substrate processing apparatus comprising:

a wetting apparatus comprising a wet chamber and being configured to supply a fluid onto a substrate in the wet chamber;

a substrate weight measurement apparatus configured to measure a weight of the substrate which has passed through the wetting apparatus and which has thereon fluid from only the wetting apparatus; and a drying apparatus comprising a drying chamber and being configured to dry, in the drying chamber, the substrate which has passed through the substrate weight measurement apparatus, wherein the substrate weight measurement apparatus comprises:

a measurement chamber that is between the wet chamber and the drying chamber and immediately adjacent to both the wet chamber and the drying chamber and that provides a measurement space which is maintained at a pressure in a certain range;

a measurement stage in the measurement chamber; and a weight sensing sensor configured to sense the weight of the substrate disposed on the measurement stage while the measurement space is maintained at the pressure in the certain range.

20. The substrate processing apparatus of claim 19, wherein the pressure is a lower pressure than a pressure of an outside space outside of the measurement chamber.

* * * * *